(12) United States Patent
Cho et al.

(10) Patent No.: US 11,856,823 B2
(45) Date of Patent: Dec. 26, 2023

(54) DISPLAY PANEL INCLUDING GATE LINES ON OPPOSITE SIDES OF A SHIELDING PATTERN, AND DISPLAY DEVICE INCLUDING THE SAME

(71) Applicant: Samsung Display Co., Ltd., Yongin-Si (KR)

(72) Inventors: Yoon-Jong Cho, Seongnam-si (KR); Tetsuhiro Tanaka, Hwaseong-si (KR); Young-In Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 456 days.

(21) Appl. No.: 17/202,604

(22) Filed: Mar. 16, 2021

(65) Prior Publication Data
US 2021/0359067 A1    Nov. 18, 2021

(30) Foreign Application Priority Data
May 15, 2020 (KR) .................. 10-2020-0058321

(51) Int. Cl.
| | |
|---|---|
| *H10K 59/126* | (2023.01) |
| *H10K 59/131* | (2023.01) |
| *H10K 59/121* | (2023.01) |
| *H01L 27/12* | (2006.01) |

(52) U.S. Cl.
CPC ....... *H10K 59/126* (2023.02); *H10K 59/1213* (2023.02); *H10K 59/131* (2023.02); *H01L 27/1214* (2013.01)

(58) Field of Classification Search
CPC .. H10K 59/12; H10K 59/1213; H10K 59/126; H10K 59/131; H10K 59/1315; H01L 27/1214

USPC .......................................................... 257/43
See application file for complete search history.

(56) References Cited

U.S. PATENT DOCUMENTS

2019/0081090 A1*  3/2019  Lee ................. H10K 59/126
2019/0115407 A1*  4/2019  Cho ................. H01L 27/1262
2019/0324580 A1* 10/2019  Tanaka ............. H10K 50/171

FOREIGN PATENT DOCUMENTS

KR       20180072440 A  *  6/2018  ......... H01L 27/3276
KR       102097150 B1      4/2020

OTHER PUBLICATIONS

Extended European Search Report-European Application No. 21173945.3 dated Oct. 20, 2021, citing references listed within.

* cited by examiner

*Primary Examiner* — Matthew E. Gordon
(74) *Attorney, Agent, or Firm* — CANTOR COLBURN LLP

(57) ABSTRACT

A display panel includes a first organic film layer, a first barrier layer disposed on first organic film layer, a shielding pattern disposed on the first barrier layer, a second barrier layer covering the shielding pattern and disposed on first barrier layer, a first active pattern disposed on the second barrier layer and overlapping the shielding pattern in a plan view, a gate electrode disposed on the first active pattern, an emission control line disposed on the first active pattern and adjacent to a first side of the gate electrode in the plan view, an upper compensation control line disposed on the emission control line and adjacent to a second side of gate electrode in the plan view, and a second active pattern disposed on the emission control line.

20 Claims, 21 Drawing Sheets

DISPLAY PANEL INCLUDING GATE LINES ON OPPOSITE SIDES OF A SHIELDING PATTERN, AND DISPLAY DEVICE INCLUDING THE SAME

This application claims priority to Korean Patent Application No. 10-2020-0058321, filed on May 15, 2020, and all the benefits accruing therefrom under 35 U.S.C. § 119, the content of which in its entirety is herein incorporated by reference.

BACKGROUND

Field

Exemplary implementations of the invention relate generally to a display panel and a display device including the same. More particularly, exemplary implementations of the invention relate to the display panel including a shielding pattern.

Discussion of the Background

In general, a display panel includes a circuit board and an emission layer disposed on the circuit board. As the emission layer emits light by receiving a driving current from the circuit board, the display panel displays an image. The circuit board includes a base substrate and a transistor layer disposed on the base substrate. However, an electric field may be generated by a signal and/or a voltage provided to the transistor layer. Organic materials included in the base substrate may be polarized by the electric field. The polarized organic materials have an electrical effect on the transistor layer, and eventually change the driving current. Accordingly, display quality of the display panel may be deteriorated.

SUMMARY

Some embodiments provide a display panel with improved display quality.

Some embodiments provide a display device including the display panel.

A display panel according to an embodiment includes a first organic film layer, a first barrier layer disposed on the first organic film layer, a shielding pattern disposed on the first barrier layer, a second barrier layer covering the shielding pattern and disposed on the first barrier layer, a first active pattern disposed on the second barrier layer and overlapping the shielding pattern in a plan view, a gate electrode disposed on the first active pattern, a first gate line disposed on the first active pattern and adjacent to a first side of the gate electrode in the plan view, a second gate line disposed on the emission control line and adjacent to a second side of gate electrode in the plan view, where the second side is opposite to the first side, and a second active pattern disposed on another layer on the first gate line.

According to an embodiment, the shielding pattern may include amorphous silicon.

According to an embodiment, the shielding pattern, the first active pattern, the gate electrode may overlap each other in the plan view.

According to an embodiment, a planar shape of the shielding pattern may be the same as a planar shape of the gate electrode in the plan view.

According to an embodiment, a size of the shielding pattern may be greater than or equal to a size of the gate electrode.

According to an embodiment, a maximum width of the shielding pattern in a first direction may be greater than a maximum width of the gate electrode in the first direction, and a maximum width of the shielding pattern in a second direction crossing the first direction may be greater than a maximum width of the gate electrode in the second direction.

According to an embodiment, the width of the shielding pattern in the first direction may be greater than the width of the gate electrode in the first direction by about 0.8 micrometers ($\mu$m) to about 1.2 $\mu$m.

According to an embodiment, the width of the shielding pattern in the second direction may be greater than the width of the gate electrode in the second direction by about 0.8 $\mu$m to about 1.2 $\mu$m.

According to an embodiment, a thickness of the shielding pattern may be about 500 angstroms to about 1500 angstroms.

According to an embodiment, the display panel may further include a third barrier layer disposed under the first organic film layer and a second organic film layer disposed under the third barrier layer.

According to an embodiment, a thickness of the first barrier layer may be smaller than a thickness of the second barrier layer.

According to an embodiment, a thickness of the third barrier layer may be equal to a sum of a thickness of the first barrier layer and a thickness of the second barrier layer.

According to an embodiment, the first active pattern may include polycrystalline silicon, and the second active pattern may include an oxide semiconductor.

According to an embodiment, cations may be doped in the first active pattern, and the cations may be doped in the shielding pattern.

According to an embodiment, cations may be doped in the first active pattern, and the anions may be doped in the shielding pattern.

According to an embodiment, a constant voltage may be provided to the shielding pattern.

According to an embodiment, the display panel may further include a third gate line disposed between the gate electrode and the second active pattern, and the second gate line may be disposed on the second active pattern and overlapping the third gate line in the plan view.

A display device according to an embodiment includes a display panel overlapping a display area in the plan view. The display panel includes a first organic film layer, a first barrier layer disposed on the first organic film layer, a shielding pattern disposed on the first barrier layer, a second barrier layer covering the shielding pattern and disposed on the first barrier layer, a first active pattern disposed on the second barrier layer and overlapping the shielding pattern in the plan view, a gate electrode disposed on the first active pattern, a first gate line disposed on the first active pattern and adjacent to a first side of the gate electrode in the plan view, a second gate line disposed on a layer on the first gate line and adjacent to a second side of gate electrode in the plan view, where the second side is opposite to the first side, and a second active pattern disposed on another layer on the first gate line.

According to an embodiment, the display panel may further include a third barrier layer disposed under the first organic film layer, a second organic film layer disposed under the third barrier layer, and a lower compensation control third gate line disposed between the gate electrode and the second active pattern. The second gate line may be disposed on the second active pattern and may overlap the third gate line in the plan view. The shielding pattern may be disposed between the second barrier layer and the third barrier layer, wherein cations are doped in the shielding pattern. The first active pattern may be disposed on the third barrier layer and may include polycrystalline silicon, wherein the cations are doped in the first active pattern. The second active pattern may include an oxide semiconductor.

According to an embodiment, the display device may further include an optical sensor module disposed under the display panel and overlapping a fingerprint recognition area in the plan view, and an air layer defined between the display panel and the optical sensor module and overlapping the fingerprint recognition area in the plan view. The display panel may overlap the display area and the fingerprint recognition area in the plan view. The shielding pattern may overlap the fingerprint recognition area and may not overlap the display area in the plan view.

Therefore, the display panel according to embodiments may include a base substrate, a transistor layer disposed on the base substrate, and a shielding pattern disposed inside the base substrate. For example, the base substrate may include at least one organic film layer and at least one barrier layer. As the shielding pattern is disposed between the first barrier layer and the second barrier layer, the shielding pattern may be disposed inside the base substrate. A plurality of lines and electrodes may be formed in the transistor layer, and the lines and electrodes may constitute transistors. As signals and/or voltages are provided to the lines and the electrodes, an electric field may be generated under the transistor layer. As the electric field is generated, organic materials included in the organic film layer may be polarized.

However, since the shielding pattern is disposed between the polarized organic materials and the transistor layer, electrical characteristics of the transistor may be maintained. Accordingly, display quality of the display panel may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
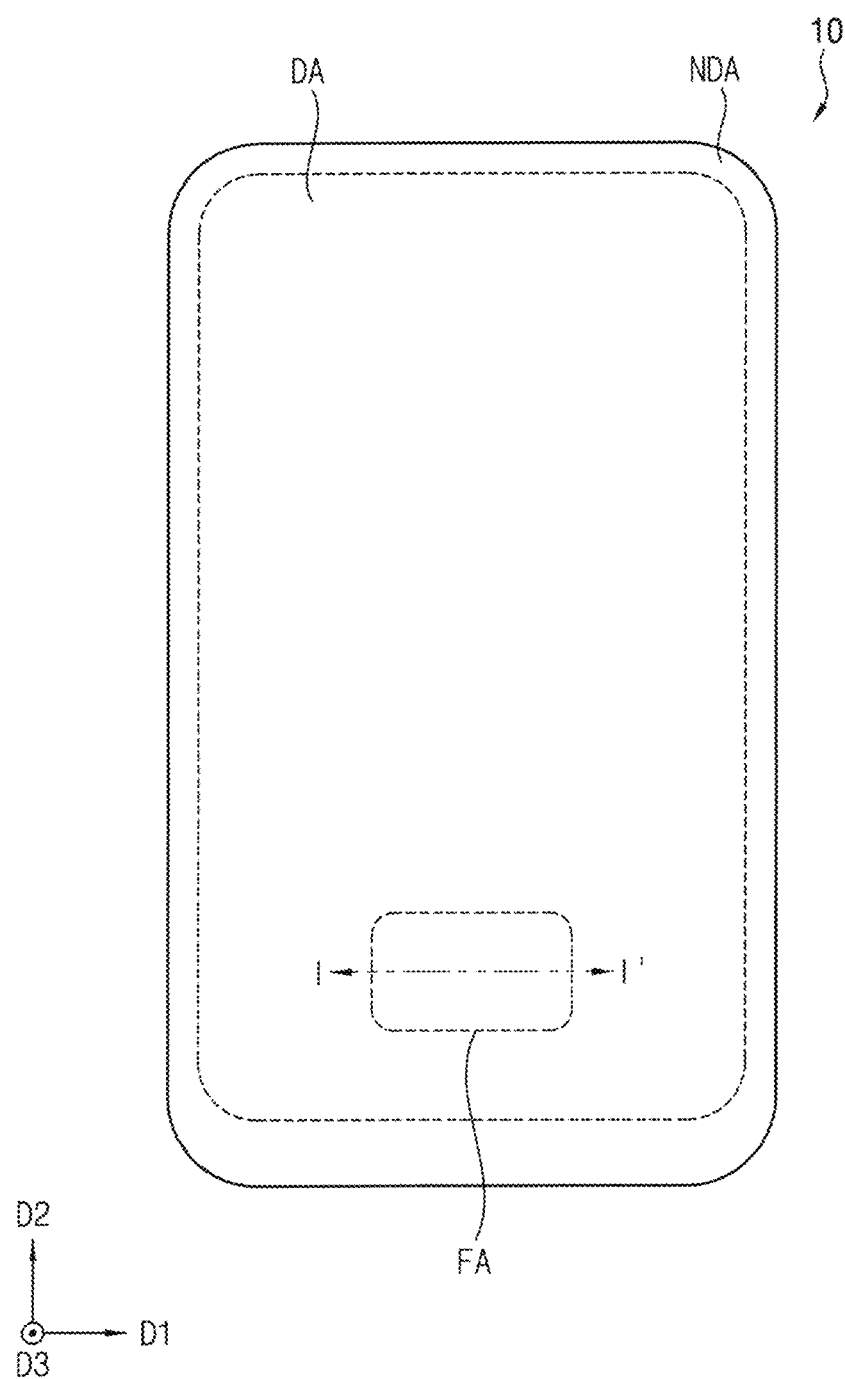
FIG. 1 is a plan view illustrating a display device according to an embodiment.

Illustrative, non-limiting embodiments will be more clearly understood from the following detailed description in conjunction with the accompanying drawings. It will be understood that when an element is referred to as being "on" another element, it can be directly on the other element or intervening elements may be present therebetween. In contrast, when an element is referred to as being "directly on" another element, there are no intervening elements present. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Figure 2:
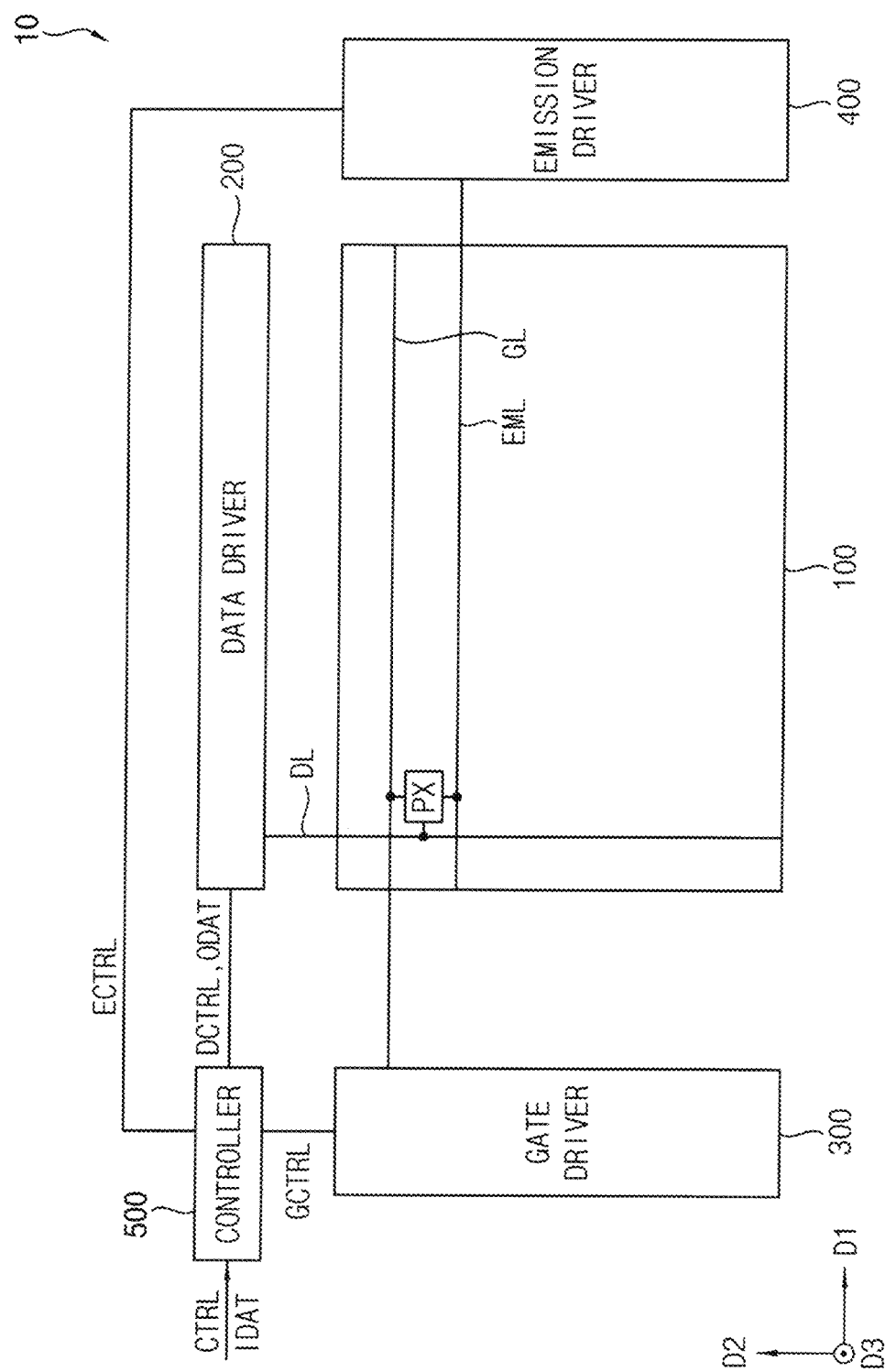
FIG. 2 is a block diagram illustrating the display device of FIG. 1.
Figure 3:
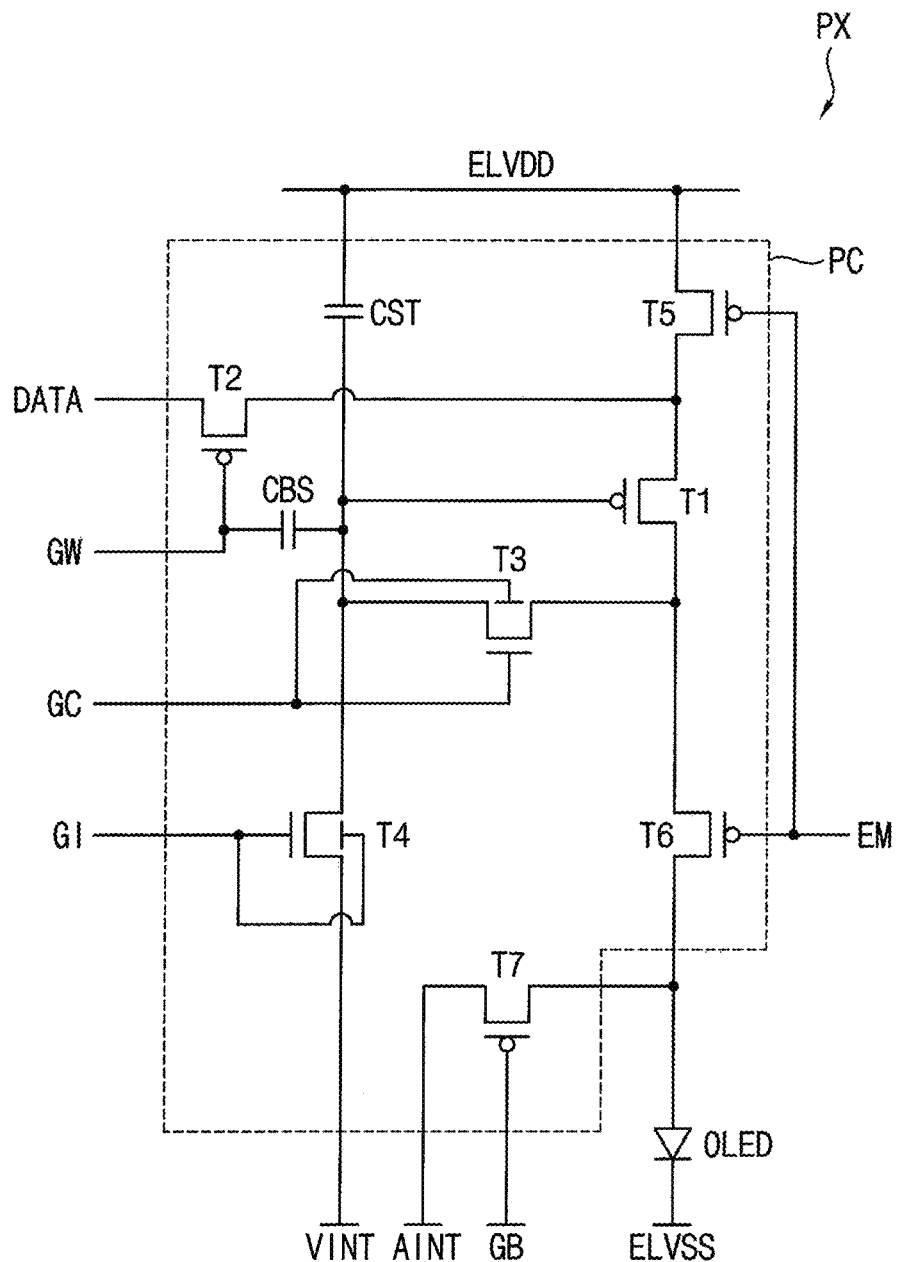
FIG. 3 is a circuit diagram illustrating a pixel circuit and an organic light emitting diode included in the display device of FIG. 2.
Figure 4:
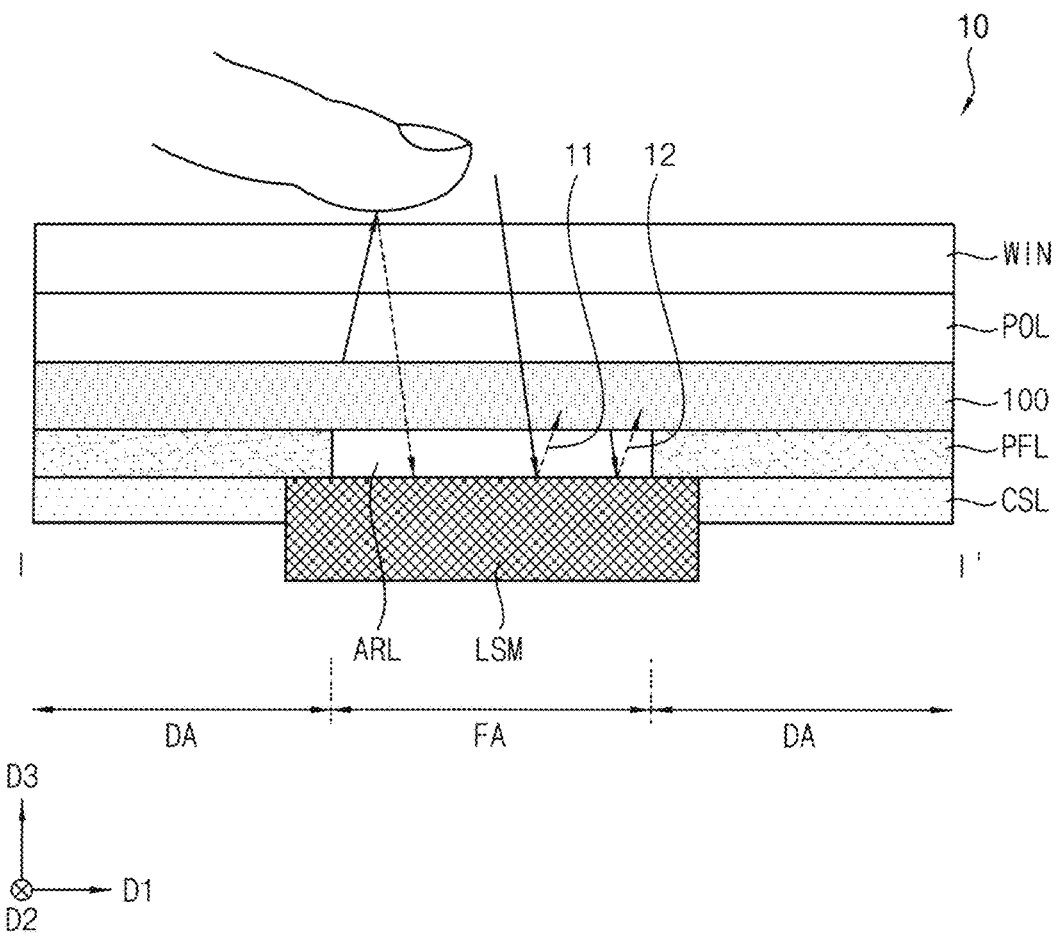
FIG. 4 is a cross-sectional view taken along line I-I' of FIG. 1.
Figure 5:
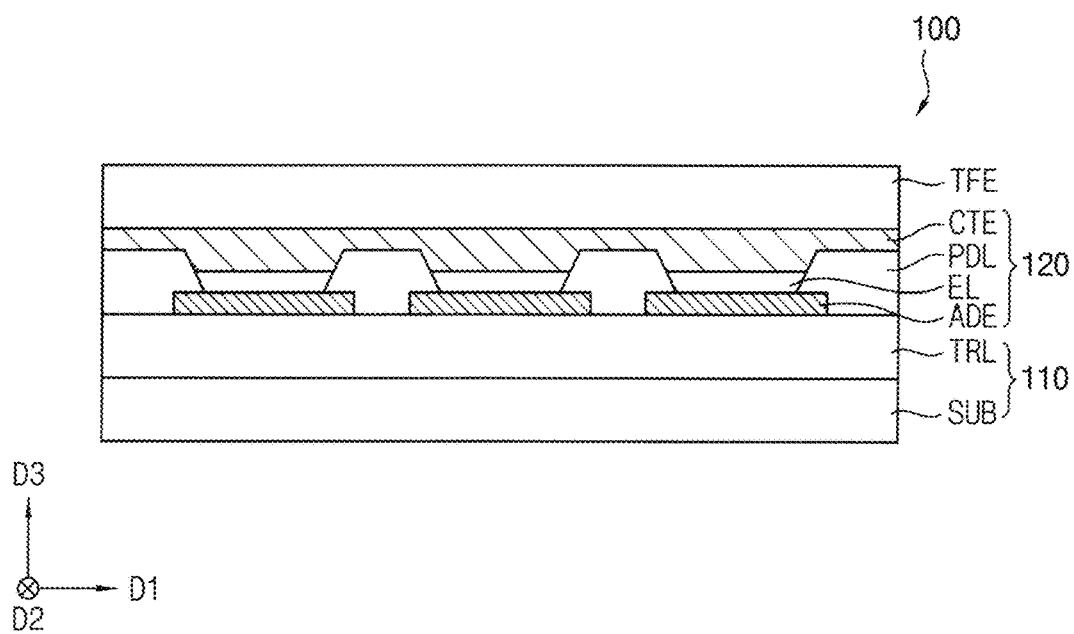
FIG. 5 is a cross-sectional view illustrating a display panel included in the display device of FIG. 1.

FIG. 1 is a plan view illustrating a display device according to an embodiment. FIG. 2 is a block diagram illustrating the display device of FIG. 1. FIG. 3 is a circuit diagram illustrating a pixel circuit and an organic light emitting diode included in the display device of FIG. 2. FIG. 4 is a cross-sectional view taken along line I-I' of FIG. 1. FIG. 5 is a cross-sectional view illustrating a display panel included in the display device of FIG. 1.

Referring to FIGS. 1 and 2, a display device 10 according to embodiment may be divided into a display area DA, a non-display area NDA, and a fingerprint recognition area FA. For example, the display area DA may have a rectangular shape having a short side extending in a first direction D1 (i.e., latitudinal direction) and a long side extending in a second direction D2 (i.e., longitudinal direction) crossing the first direction D1. The non-display area NDA may be positioned to surround the display area DA, and the display area DA may be positioned to surround the fingerprint recognition area FA. A display panel 100 may be disposed in the display area DA and the fingerprint recognition area FA to display an image. A data driver 200, a gate driver 300, an emission control driver 400, and a timing controller 500 may be disposed in the non-display area NDA.

A pixel structure PX, a data line DL connected to the pixel structure PX, a gate line GL connected to the pixel structure PX, and an emission control line EML connected to the pixel structure PX may be disposed in the display panel 100.

The data line DL may be electrically connected to the data driver 200 and may extend along the second direction D2. The data line DL may receive a data voltage (e.g., a data voltage DATA in FIG. 3) from the data driver 200 and may provide the data voltage DATA to a pixel circuit (e.g., a pixel circuit PC in FIG. 3).

The gate line GL may be connected to the gate driver 300 and may extend along the first direction D1. The gate line GL may receive a gate signal (e.g., a first gate signal GW, a second gate signal GC, a third gate signal GI, a fourth gate signal GB in FIG. 3) from the gate driver 300 and may provide the gate signal to the pixel circuit PC.

The emission control line EML may be connected to the emission control driver 400 and may extend along the first direction D1. The emission control line EML may receive an emission control signal (e.g., emission control signal EM in FIG. 3) from the emission control driver 400 and may provide the emission control signal EM to the pixel circuit PC. For example, an activation period of the emission control signal EM may be an emission period of the display device 10, and an inactivation period of the emission control signal EM is a non-emission period of the display device 10.

The gate driver 300 may receive a gate control signal GCTRL from the timing controller 500 and may generate the gate signal. For example, the gate signal may include a first gate signal GW, a second gate signal GC, a third gate signal GI, and a fourth gate signal GB.

The data driver 200 may receive an output image data ODAT and a data control signal DCTRL from the timing controller 500 to generate the data voltage DATA. The emission control driver 400 may receive an emission drive control signal ECTRL from the timing controller 500 and may generate the emission control signal EM. The timing controller 500 may receive a control signal CTRL and an input image data IDAT from an external device to control the data driver 200, the gate driver 300, and the emission control driver 400.

In an embodiment, for example, the data driver 200 and the timing controller 500 may be disposed on a flexible printed circuit board, the gate driver 300 may be mounted in the non-display area NDA adjacent to a left side of the display area DA, and the emission control driver 400 may be mounted in the non-display area NDA adjacent to a right side of the display area DA. However, a structure in which the data driver 200, the gate driver 300, the emission control driver 400, and the timing controller 500 are disposed according to the invention is not limited thereto.

Referring to FIGS. 2 and 3, the pixel structure PX may include a pixel circuit PC and an organic light emitting diode OLED.

The pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED to provide a driving current to the organic light emitting diode OLED.

The organic light emitting diode OLED may include a first terminal (e.g., an anode terminal) and a second terminal (e.g., a cathode terminal). The first terminal of the organic light emitting diode OLED may be connected to the first transistor T1 through the sixth transistor T6 to receive the driving current, and the second terminal may receive a low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive a high power voltage ELVDD. The storage capacitor CST may maintain a voltage level of a gate terminal of the first transistor T1 during an inactive period of the first gate signal GW.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the organic light emitting diode OLED through the sixth transistor T6 to provide the driving current. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a P-channel metal-oxide-semiconductor ("PMOS") transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a back gate terminal, a first terminal (e.g., a source terminal), and a second terminal (e.g., a drain terminal). The gate terminal and the back gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an N-channel metal-oxide-semiconductor ("NMOS") transistor, the third transistor T3 may be turned on when the second gate signal GC has a positive voltage level, and may be turned off when the second gate signal GC has a positive voltage level.

During a period in which the third transistor T3 is turned on in response to the second gate signal GC, the third transistor T3 may diode-connect the first transistor T1. Since the first transistor T1 is diode-connected, a voltage difference equal to a threshold voltage of the first transistor T1 between the gate terminal of the first transistor T1 and the first terminal of the first transistor T1 may occur. Accordingly, a voltage obtained by adding the data voltage DATA and the voltage difference may be provided to the gate terminal of the first transistor T1 during a period in which the third transistor T3 is turned on. Accordingly, the third transistor T3 may compensate for the threshold voltage of the first transistor T1. For example, the third transistor T3 may be referred to as a compensation transistor.

The fourth transistor T4 may include a gate terminal, a back gate terminal, a first terminal (e.g., a source terminal), and a second terminal (e.g., a drain terminal). The gate terminal and the back gate terminal of the fourth transistor T4 may receive the third gate signal GI. The first terminal of the fourth transistor T4 may receive a gate initialization voltage VINT. The second terminal of the fourth transistor T4 may be connected to the gate terminal of the first transistor T1.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level, While the fourth transistor T4 is turned on in response to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission control signal EM, the sixth transistor T6 may provide the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may be connected to the first terminal of the organic light emitting diode OLED. The second terminal of the seventh transistor T7 may receive an anode initialization voltage AINT. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT. For example, the seventh transistor T7 may be referred to as an initialization transistor.

In an embodiment, the first, second, fifth, sixth, and seventh transistors T1, T2, T5, T6, and T7 may be PMOS transistors, and the third and fourth transistors T3 and T4 may be NMOS transistors. Accordingly, active patterns of the PMOS transistors may include a silicon thin film doped with cations, and the active patterns of the NMOS transistors may include an oxide semiconductor. In addition, the first gate signal GW, the emission control signal EM, and the fourth gate signal GB for tuning on the second, fifth, sixth, and seventh transistors T2, T5, T6, and T7 may have negative voltage levels. The second gate signal GC and the third gate signal GI for tuning on the third and fourth transistors T3 and T4 may have positive voltage levels.

A connection structure of the pixel circuit PC shown in FIG. 3 is exemplary and may be variously changed.

Referring to FIGS. 1, 4, and 5, the display device 10 may include the display panel 100, an optical sensor module LSM, and various functional layers disposed above or below the display panel 100. For example, the functional layers may include a cushion layer CSL, a protective film PFL, an air layer ARL, a polarizing plate POL, and a window WIN. In addition, an adhesive layer may be disposed between the functional layers CSL, PFL, ARL, POL, WIN, and the adhesive layer may be an optically clear adhesive ("OCA").

The display panel 100 may overlap the display area DA and the fingerprint recognition area FA in a plan view. As shown in FIG. 5, the display panel 100 may include a circuit board 110, an emission layer 120 disposed on the circuit board 110, and a thin film encapsulation TFE disposed on the emission layer 120. The circuit board 110 may include a base substrate SUB and a transistor layer TRL, and the emission layer 120 may include a first electrode ADE, a pixel defining layer PDL, an organic emission layer EL, and a second electrode CTE. The emission layer 120 may emit light by receiving the driving current from the circuit board 110.

The protective film PFL may be disposed under the display panel 100. The protective film PFL may overlap the display area DA and may not overlap the fingerprint recognition area FA in a plan view. In other words, an opening overlapping the fingerprint recognition area FA in a plan view may be defined in the protective film PFL. The protective film PFL may include a plastic material and may support the display panel 100.

The air layer ARL may be disposed under the display panel 100. The air layer ARL may be filled with air. The air layer ARL may overlap the fingerprint recognition area FA and may not overlap the display area DA in a plan view. In other words, the air layer ARL may be defined in the opening. Light may be smoothly transmitted to the optical sensor module LSM through the air layer ARL.

The cushion layer CSL may be disposed under the protective film PFL. The cushion layer CSL may overlap the display area DA and may not overlap the fingerprint recognition area FA in a plan view. In other words, an opening overlapping the fingerprint recognition area FA may be defined in the cushion layer CSL. The cushion layer CSL may include an elastic body and may protect the display panel 100 from external impact.

The optical sensor module LSM may be disposed under the protective film PFL. The optical sensor module LSM may overlap the fingerprint recognition area FA in a plan view. In other words, the optical sensor module LSM may be disposed in the opening defined in the cushion layer CSL. The optical sensor module LSM may recognize a user's fingerprint. For example, light emitted from the display panel 100 may be reflected by the user's finger on the window WIN, and the optical sensor module LSM may detect the light reflected from the finger. In order for the optical sensor module LSM to detect light, the optical sensor module LSM may be exposed by the air layer ARL.

The polarization layer POL may be disposed on the display panel 100. As the polarization layer POL polarizes external light, light emitted from the display panel 100 may be clearly visually recognized by a user.

The window WIN may be disposed on the polarizing layer POL. The window WIN may be made of glass, plastic, or the like, and may protect the display panel 100 from external impact.

As the air layer ARL is defined under the display panel 100, light reflected from the fingerprint recognition area FA may be incident on the display panel 100. For example, a light 11 incident from the outside and reflected from the optical sensor module LSM and/or a light 12 emitted from the display panel 100 and reflected from the optical sensor module LSM may be incident to the display panel 100.

The above-described transistors may be disposed in the transistor layer TRL, and an electric field may be generated in the transistor layer TRL by the signals and the voltages provided to the transistors. The base substrate SUB may include a dielectric material such as an organic material, and the organic materials may be polarized by the electric field. The polarized organic materials may have an electrical effect on the transistors, and the electric effect may deteriorate display quality of the display device 10. In addition, the organic materials may be further polarized by light incident to the display panel 100.

However, since the display device 10 according to the invention includes a shielding pattern (e.g., a shielding pattern SDP of FIGS. 8, 21, and 22) inside of the base substrate SUB, the shielding pattern may effectively prevent the transistor layer TRL from being electrically affected by the polarization phenomenon. Accordingly, the display quality of the display device 10 may be improved. A detailed description of this will be given with reference to FIGS. 21 and 22.

FIG. 6 to FIG. 20 are layout diagrams illustrating a pixel of the display panel of FIG. 5.

Figure 6:
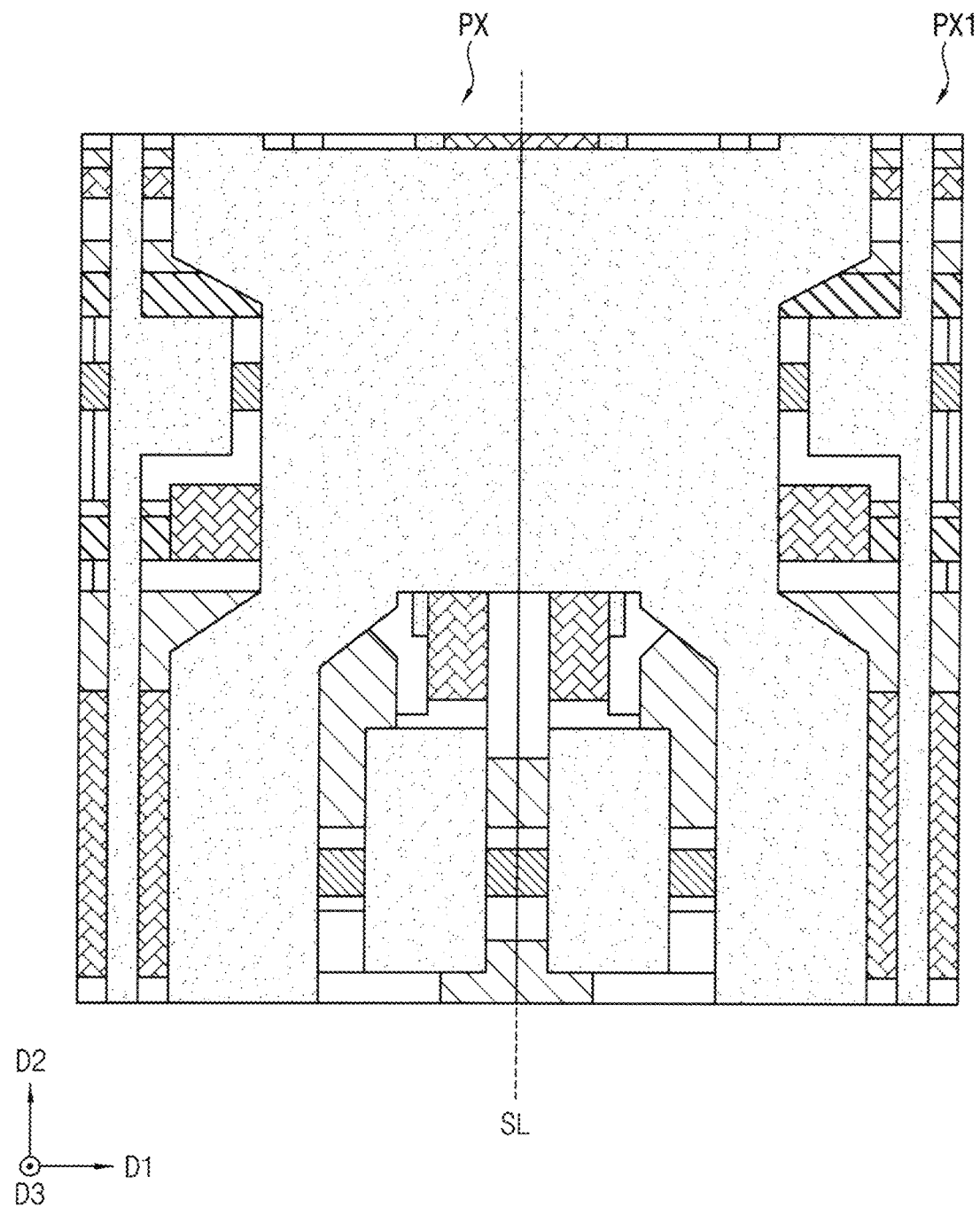
FIG. 6 to FIG. 20 are layout diagrams illustrating a pixel of the display panel of FIG. 5.

Referring to FIG. 6, the display panel 100 may include the pixel structure PX and a symmetric pixel structure PX1 adjacent to the pixel structure PX. For example, a structure of the symmetric pixel structure PX1 may be a substantially same as a structure in which a structure of the pixel structure PX is symmetrical with respect to the virtual symmetric line SL. Hereinafter, the pixel structure PX will be described.

Referring to FIGS. 3, 4, 5, 6, and 7, the pixel structure PX may include the base substrate SUB and the shielding pattern SDP disposed in the base substrate SUB.

The base substrate SUB may include a glass substrate, a quartz substrate, a plastic substrate, or the like. In an embodiment, the base substrate SUB may include a plastic substrate, and thus the display device 10 may have a flexible characteristic. In this case, the base substrate SUB may have a structure in which at least one organic film layer and at least one barrier layer are alternately stacked. For example, the organic film layer may include or be formed using an organic material such as polyimide, and the barrier layer may be formed using an inorganic material.

The shielding pattern SDP may be disposed inside the base substrate SUB. For example, the base substrate SUB may include the barrier layer, and the shielding pattern SDP may be disposed inside the barrier layer. For example, after forming a first barrier layer (e.g., BRR2 in FIG. 21) on the organic film layer (e.g., PI2 in FIG. 21), the shielding pattern SDP may be disposed on the first barrier layer, and a second barrier layer (e.g., BRR3 in FIG. 21) may be disposed to cover the shielding pattern SDP. The shielding pattern SDP may be disposed inside the base substrate SUB by being disposed between the first and second barrier layers.

In an embodiment, the shielding pattern SDP may include a silicon semiconductor. For example, the shielding pattern SDP may include amorphous silicon or polycrystalline silicon. In addition, the shielding pattern SDP may be doped with cations or anions. For example, the cations may be a group III element (e.g., boron). The anions may be a group V element (e.g., phosphorus).

In an embodiment, the shielding pattern SDP may completely overlap a gate electrode (e.g., a gate electrode 1220 of FIG. 9) to be described later in a plan view. In other words, a shape of the shielding pattern SDP may be a substantially same as a shape of the gate electrode 1220, and a size of the shielding pattern SDP may be greater than or equal to a size of the gate electrode 1220.

Figure 7:
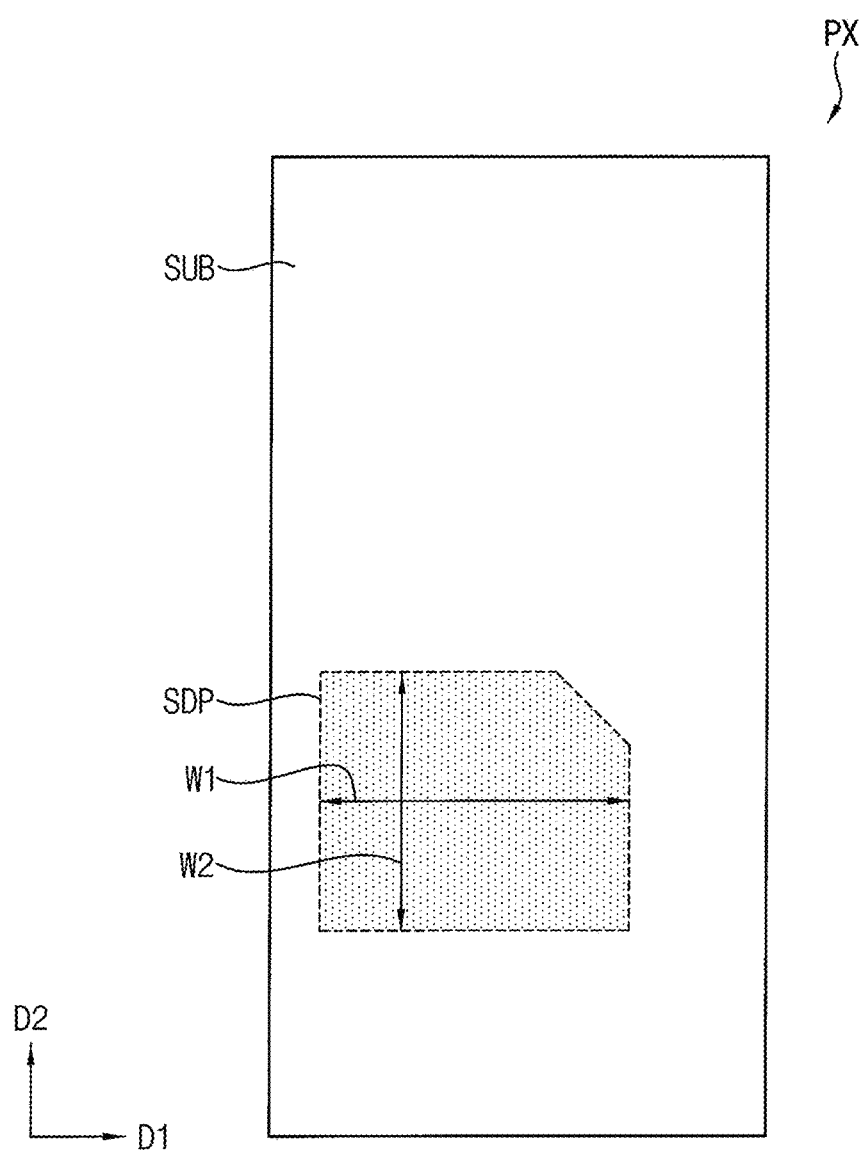

In an embodiment, as shown in FIG. 7, the shielding pattern SDP may have a pentagonal shape, and may have a first width W1 in the first direction D1 and a second width W2 in the second direction D2. In addition, the gate electrode 1220 may have the pentagonal shape, and may have a third width W3 in the first direction D1 and a fourth width W4 in the second direction D2. The first width W1 (e.g., maximum width in the first direction D1) may be greater than the third width W3 (e.g., maximum width in the first direction D1) by about 0.8 micrometers (µm) to about 1.2 µm, and the second width W2 (e.g., maximum width in the second direction D2) may be greater than the fourth width W4 (e.g., maximum width in the second direction D2) by about 0.8 µm to about 1.2 µm.

In an embodiment, a thickness of the shielding pattern SDP may be set according to a doping concentration of the cations doped in the shielding pattern SDP or a doping concentration of the anions doped in the shielding pattern SDP. For example, when the thickness of the shielding pattern SDP is thin compared to the doping concentration, the cations or the anions may be doped not only in the shielding pattern SDP but also in the base substrate SUB. Alternatively, when the thickness of the shielding pattern SDP is thick compared to the doping concentration, the cations or the anions may be insufficiently doped in the shielding pattern SDP. Therefore, it is desirable for the thickness of the shielding pattern SDP be set corresponding to a doping concentration of the cations or a doping concentration of the anions doped in the shielding pattern SDP. In an embodiment, when the shielding pattern SDP is doped with boron having a concentration of about 1012, the thickness of the shielding pattern SDP may be about 500 angstroms to about 1500 angstroms. As used herein, the term "thickness direction of a layer" refers to a direction perpendicular to a major surface plane (i.e., a plane defined by the directions D1 and D2 in the figures) defining the layer, like the direction D3 in FIGS. 5 and 21.

A buffer layer (e.g., BFR in FIG. 21) may be disposed on the base substrate SUB. The buffer layer may prevent diffusion of metal atoms or impurities from the base substrate SUB into a first active pattern (e.g., a first active pattern 1100 of FIG. 8). In addition, the buffer layer may help the first active pattern 1100 to be uniformly formed by controlling a heat supply rate during a crystallization process for forming the first active pattern 1100.

Figure 8:
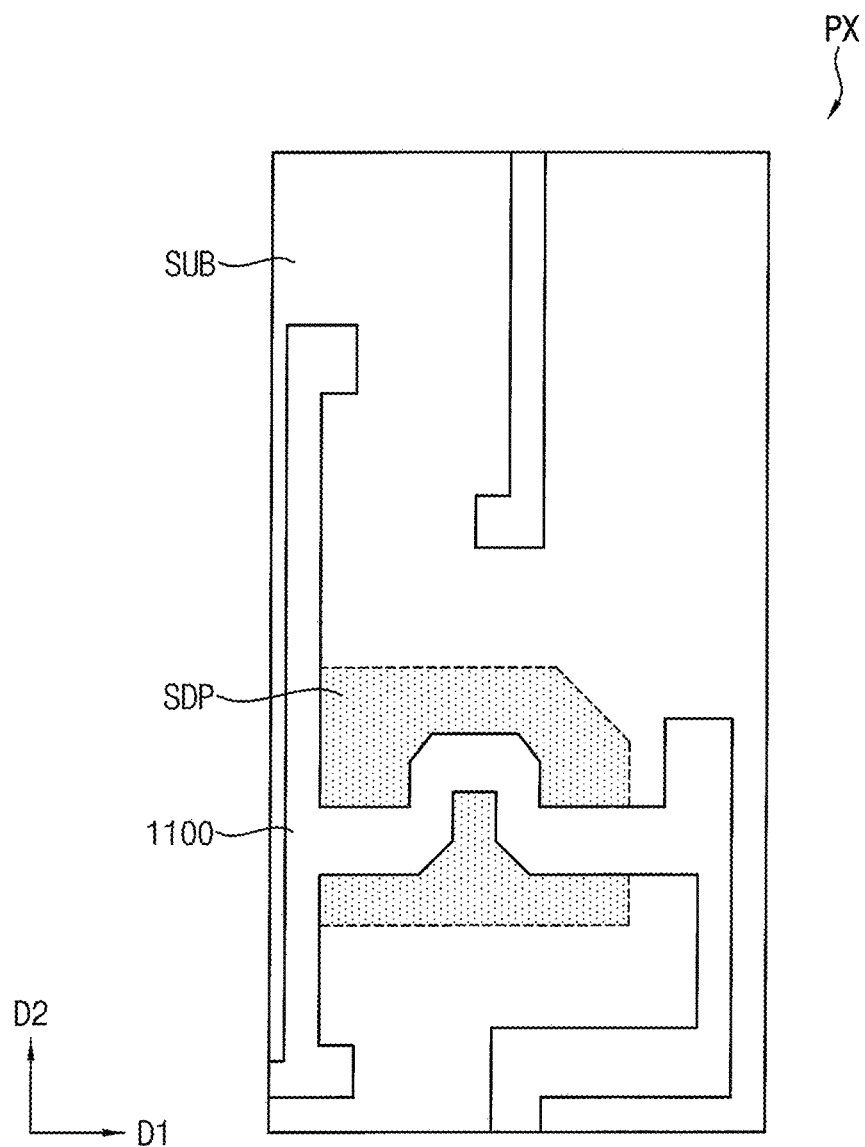
Figure 21:
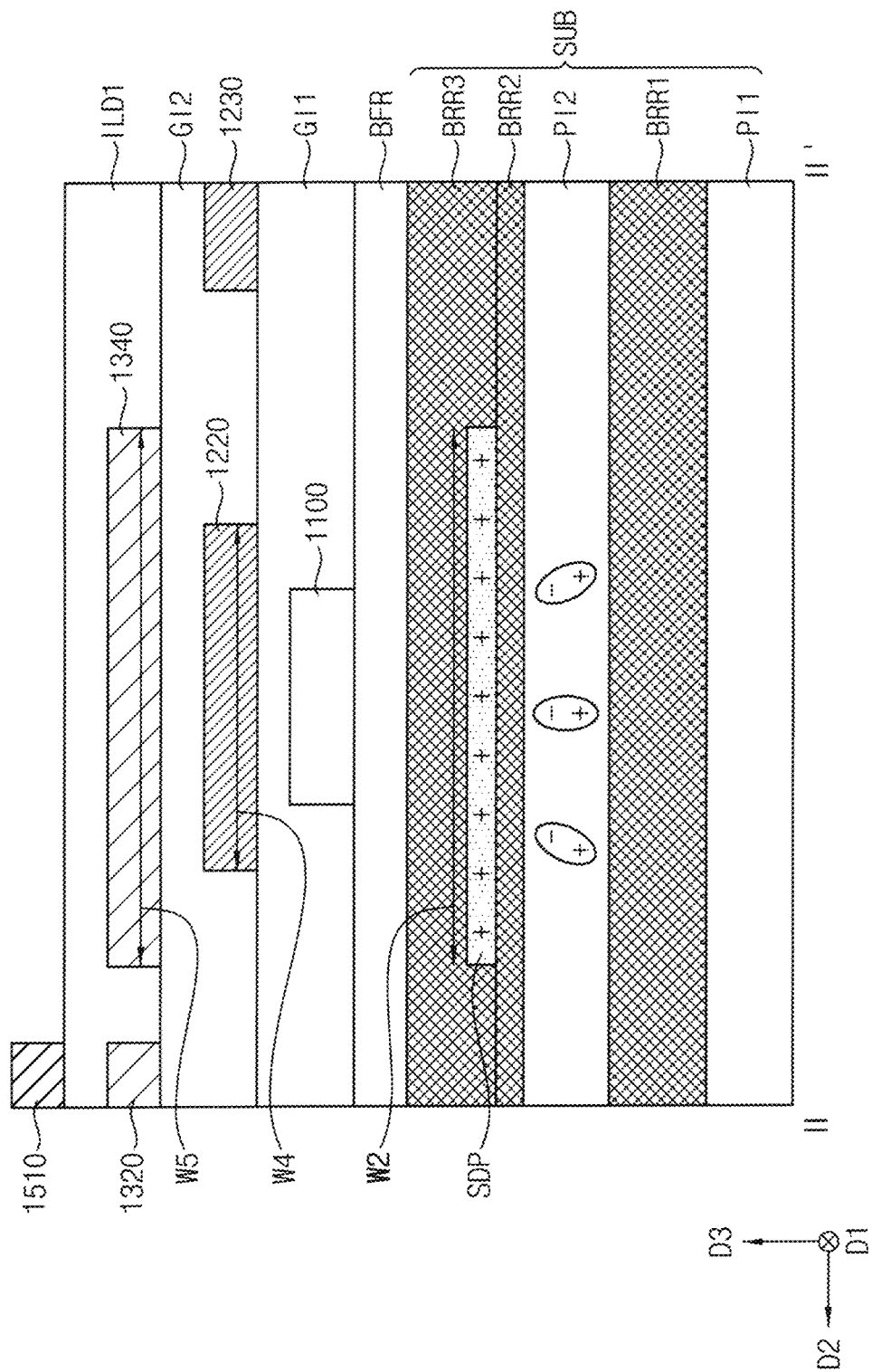
FIG. 21 is a cross-sectional view illustrating an example taken along line II-II' of FIG. 16.

Referring to FIGS. 8 and 21, the first active pattern 1100 may be disposed on the buffer layer BFR. In an embodiment, the first active pattern 1100 may include a silicon semiconductor. For example, the first active pattern 1100 may include amorphous silicon, polycrystalline silicon, or the like.

In an embodiment, cations or anions may be selectively doped to the first active pattern 1100. For example, when the first, second, fifth, sixth, and seventh transistors T1, T2, T5, T6, and T7 are the PMOS transistors, the first active pattern 1100 may include a source region to which the cations are doped, a drain region to which the cations are doped, and a channel region to which the cations are not doped.

A first gate insulating layer (e.g., a first gate insulating layer GI1 in FIG. 21) may cover the first active pattern 1100 and may be disposed on the buffer layer BFR. The first gate insulating layer may include an insulating material. For example, the first gate insulating layer GI1 may include silicon oxide, silicon nitride, titanium oxide, tantalum oxide, or the like.

Figure 9:
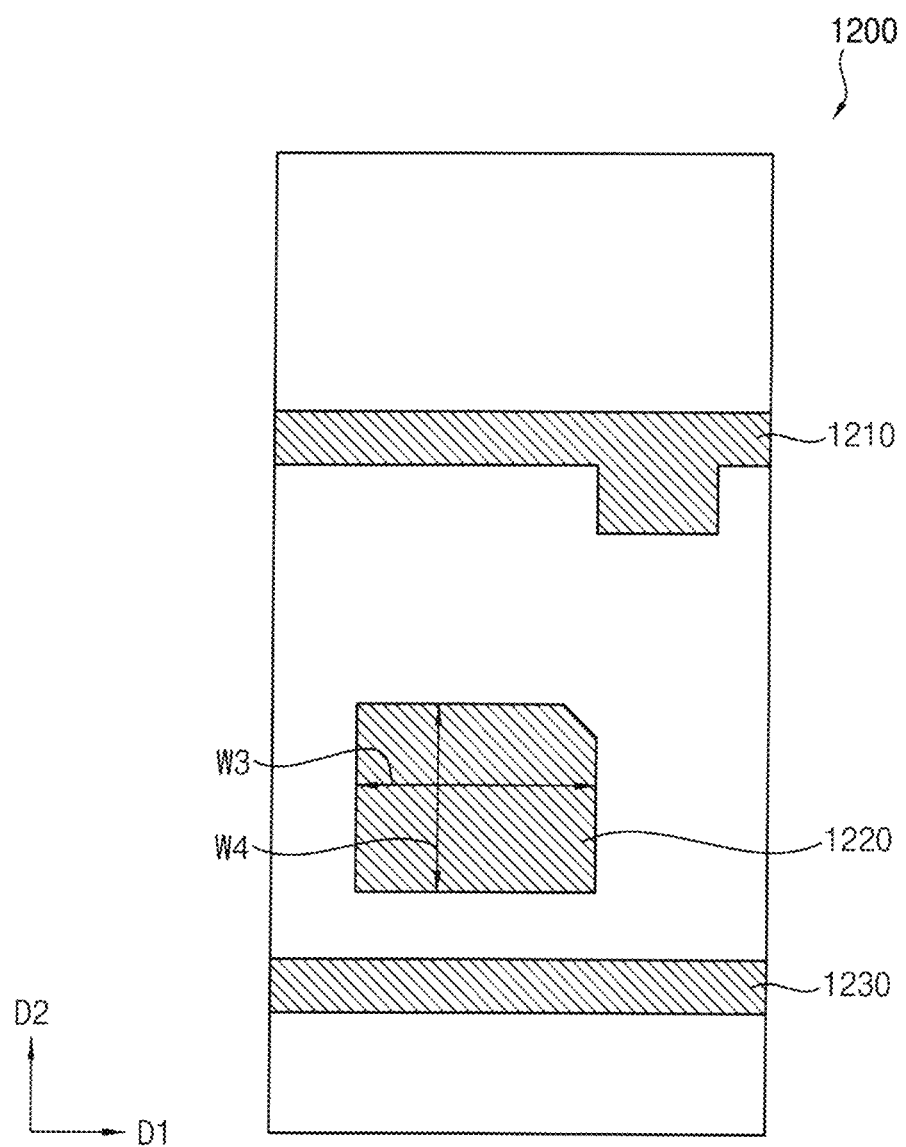
Figure 10:
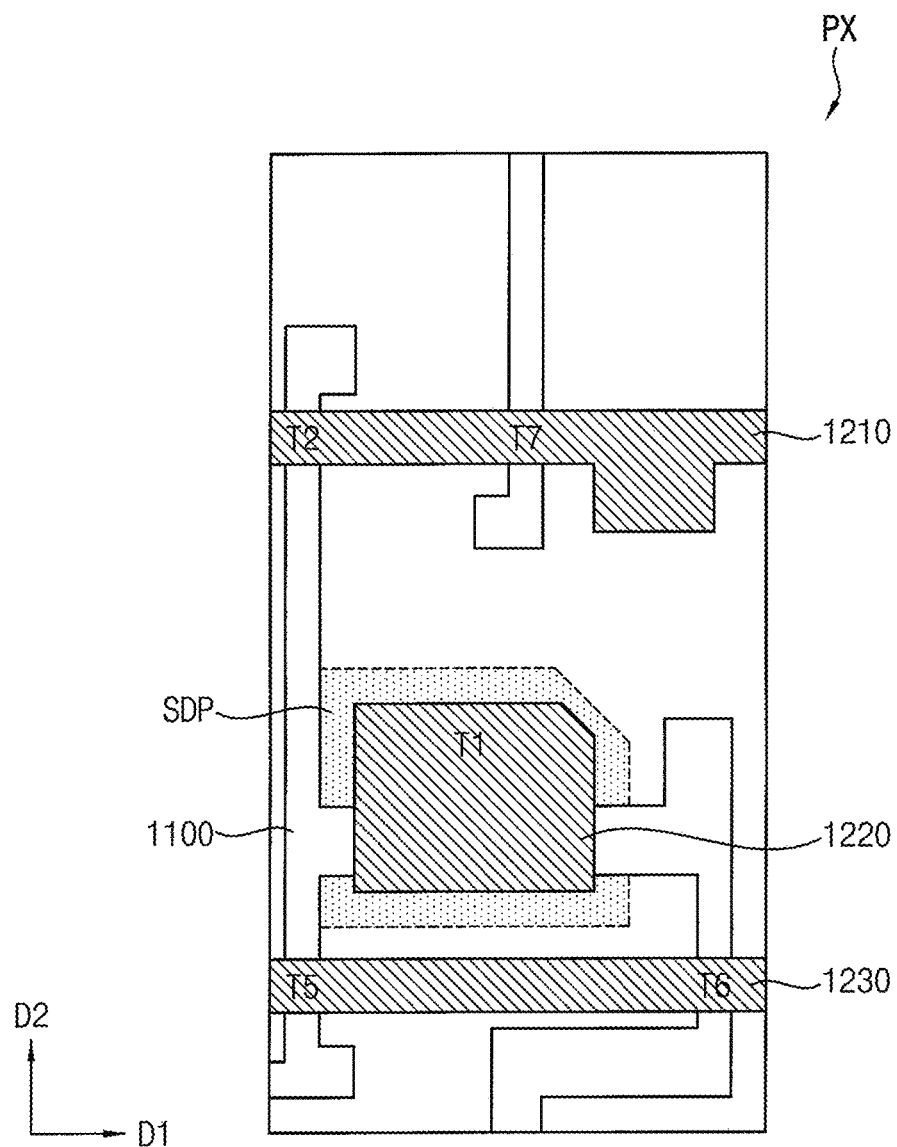

Referring to FIGS. 9 and 10, a first conductive pattern 1200 may be disposed on the first gate insulating layer GI1. The first conductive pattern 1200 may include a first gate line 1210, a gate electrode 1220, and a second gate line 1230.

The first gate line 1210 may be disposed on the first active pattern 1100 and may extend in the first direction D1. For example, the first gate line 1210 may constitute the second transistor T2 together with a part of the first active pattern 1100. The first gate signal GW may be provided to the first gate line 1210.

In an embodiment, for example, the first gate line 1210 may constitute the seventh transistor T7 together with another part of the first active pattern 1100. The fourth gate signal GB may be provided to the first gate line 1210. For example, the first gate signal GW and the fourth gate signal GB may have a substantially same waveform with a time difference.

The gate electrode 1220 may constitute the first transistor T1 together with a part of the first active pattern 1100.

The second gate line 1230 may be disposed on the first active pattern 1100 and may extend in the first direction D1. In an embodiment, the second gate line 1230 may be adjacent to a first side of the gate electrode 1220 in the same plane (or in the plan view). For example, the second gate line 1230 may constitute the fifth and sixth transistors T5 and T6 together with a part of the first active pattern 1100. The emission control signal EM may be provided to the second gate line 1230. For example, the second gate wiring 1230 may be referred to as an emission control line.

In an embodiment, for example, the first conductive pattern 1200 may include a metal, an alloy, a conductive metal oxide, a transparent conductive material, or the like. For example, the first conductive pattern 1200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like.

A second gate insulating layer (e.g., a second gate insulating layer GI2 in FIG. 21) may cover the first conductive pattern 1200 and may be disposed on the first gate insulating layer. The second gate insulating layer may include an insulating material.

The first, second, fifth, sixth, and seventh transistors T1, T2, T5, T6, and T7 may be a substantially same as the first, second, fifth, sixth and seventh transistors T1, T2, T5, T6, and T7 described with reference to FIG. 3. For example, the gate electrode 1220 may correspond to the gate terminal of the first transistor T1 described with reference to FIG. 3. However, this correspondence relationship will not be described in detail, and may be apparent to those skilled in the art to which the present invention.

Figure 11:
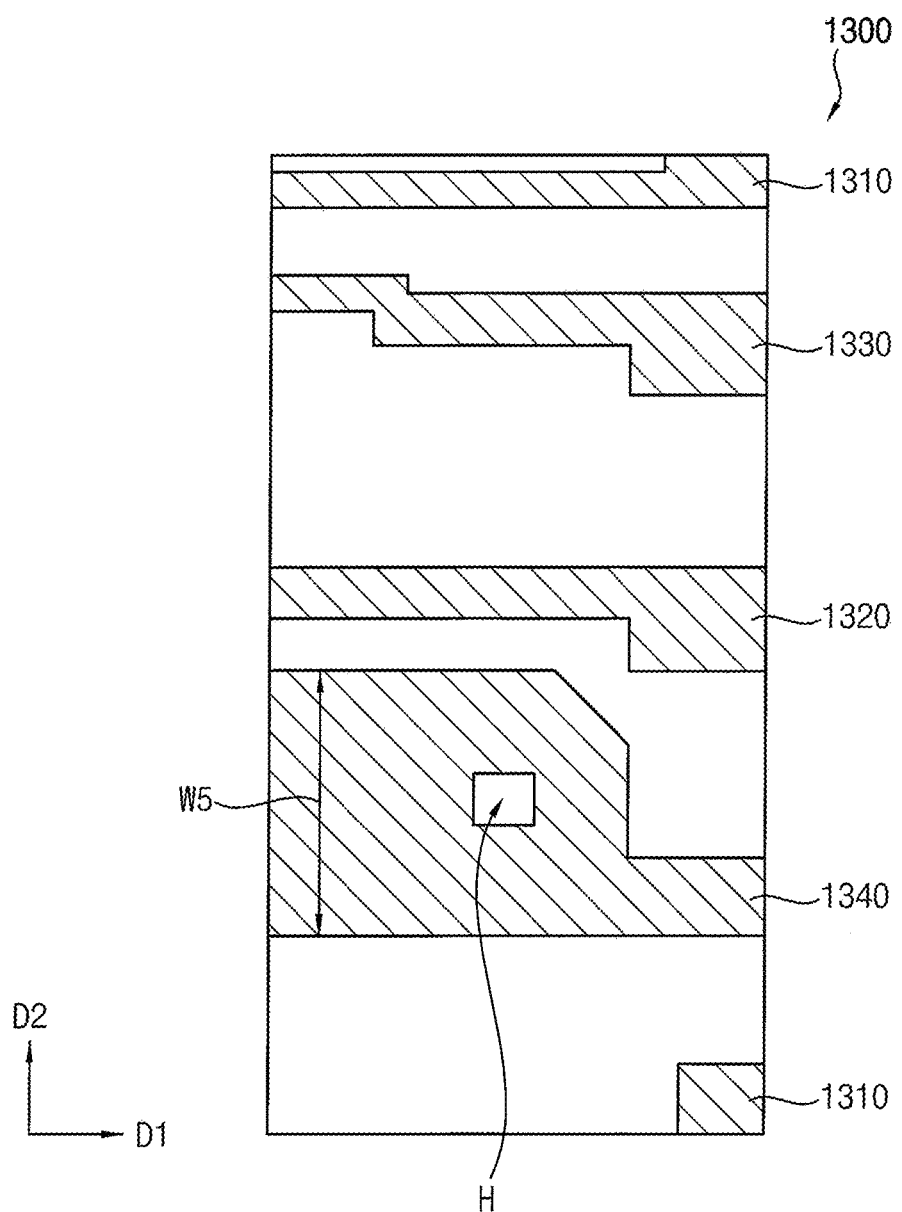
Figure 12:
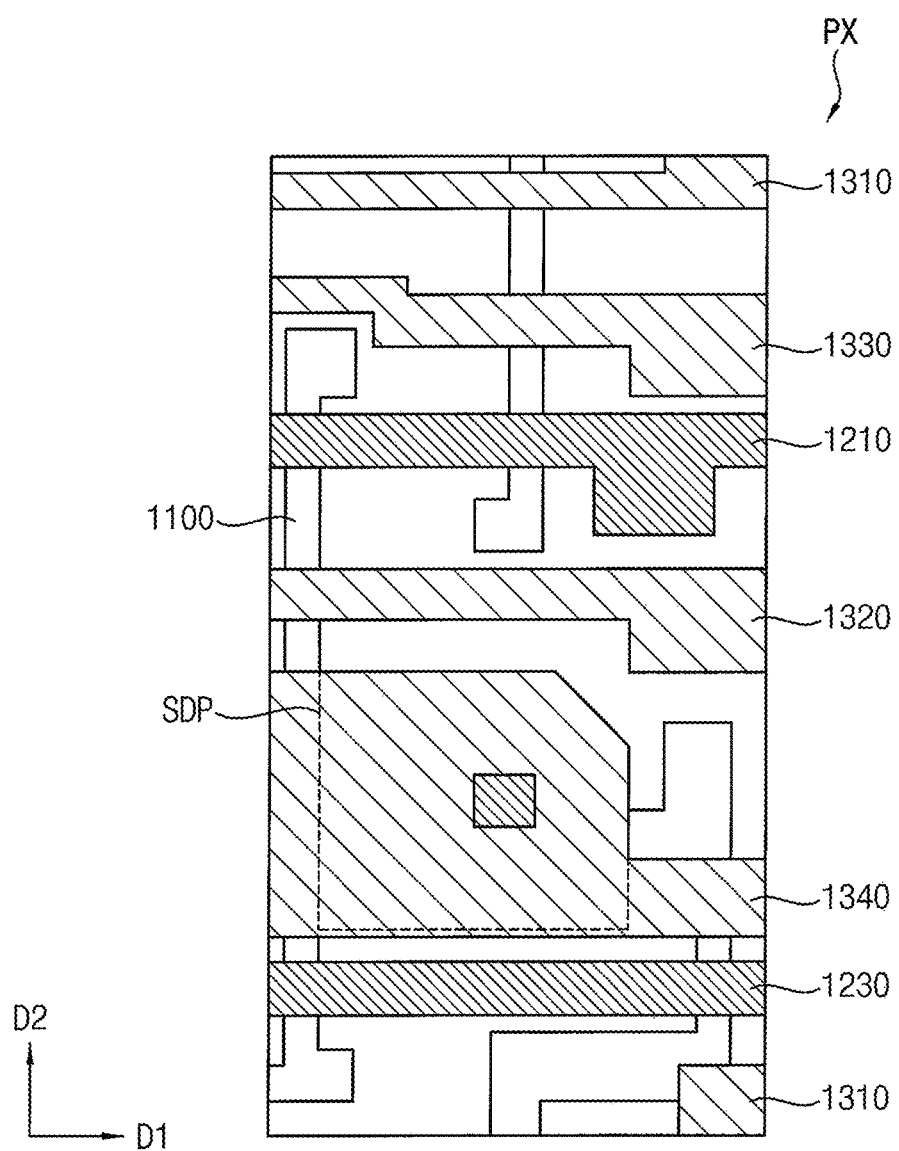

Referring to FIGS. 11 and 12, the second conductive pattern 1300 may be disposed on the second gate insulating layer. The second conductive pattern 1300 may include a gate initialization voltage line 1310, a third gate line 1320, a fourth gate line 1330, and a storage capacitor electrode 1340.

The gate initialization voltage line 1310 may extend in the first direction D1. In an embodiment, the gate initialization voltage line 1310 may provide the gate initialization voltage VINT to the fourth transistor T4. For example, the gate initialization voltage line 1310 may provide the gate initialization voltage VINT to a second active pattern (e.g., a second active pattern 1400 of FIG. 13) to be described later.

The third gate line 1320 may extend in the first direction D1. In an embodiment, the third gate line 1320 may be adjacent to a second side opposite to the first side of the gate electrode 1220 in a plan view. In an embodiment, the third gate line 1320 may provide the second gate signal GC to the third transistor T3. For example, the third gate line 1320 may function as the back gate terminal of the third transistor T3. For example, the third gate line 1320 may be referred to as a lower compensation control line.

The fourth gate line 1330 may extend in the first direction D1. In an embodiment, the fourth gate line 1330 may provide the third gate signal GI to the fourth transistor T4. For example, the fourth gate line 1330 may function as the back gate terminal of the fourth transistor T4.

The storage capacitor electrode 1340 may extend in the first direction D1. In an embodiment, the storage capacitor electrode 1340 may form the storage capacitor CST together with the gate electrode 1220. For example, the storage capacitor electrode 1340 may overlap the gate electrode 1220 in a plan view, and the high power voltage ELVDD may be provided to the storage capacitor electrode 1340.

In an embodiment, an opening H exposing an upper surface of the gate electrode 1220 may be defined in the storage capacitor electrode 1340. For example, through the opening H, the gate terminal of the first transistor T1 may be electrically connected to the second terminal of the third transistor T3.

In an embodiment, the storage capacitor electrode 1340 may have a fifth width W5 in the second direction D2. The fifth width W5 may be a substantially same as the second width W2 of the shielding pattern SDP.

For example, the second conductive pattern 1300 may include a metal, an alloy, a conductive metal oxide, a transparent conductive material, or the like.

A first interlayer insulating layer (e.g., a first interlayer insulating layer ILD1 in FIG. 21) may cover the second conductive pattern 1300 and may be disposed on the second gate insulating layer. The first interlayer insulating layer may include an insulating material.

Figure 13:
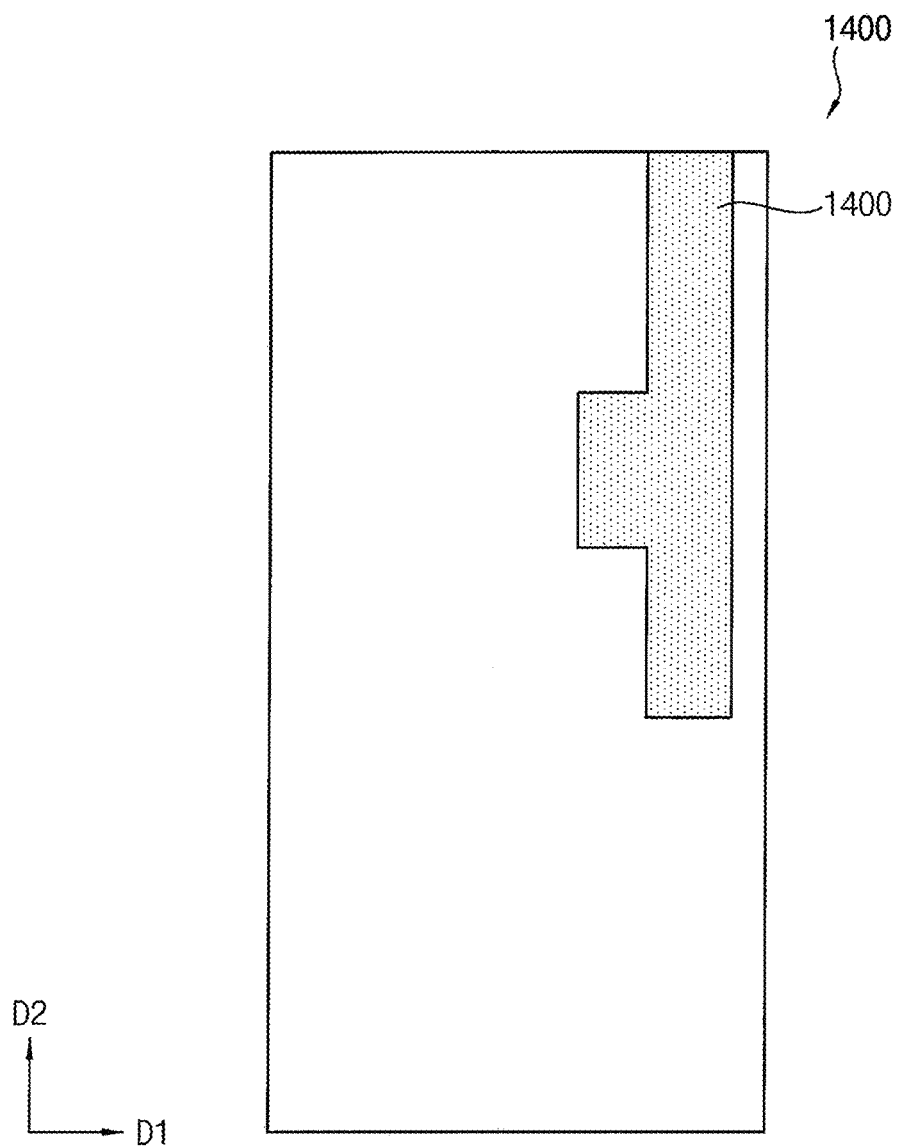
Figure 14:
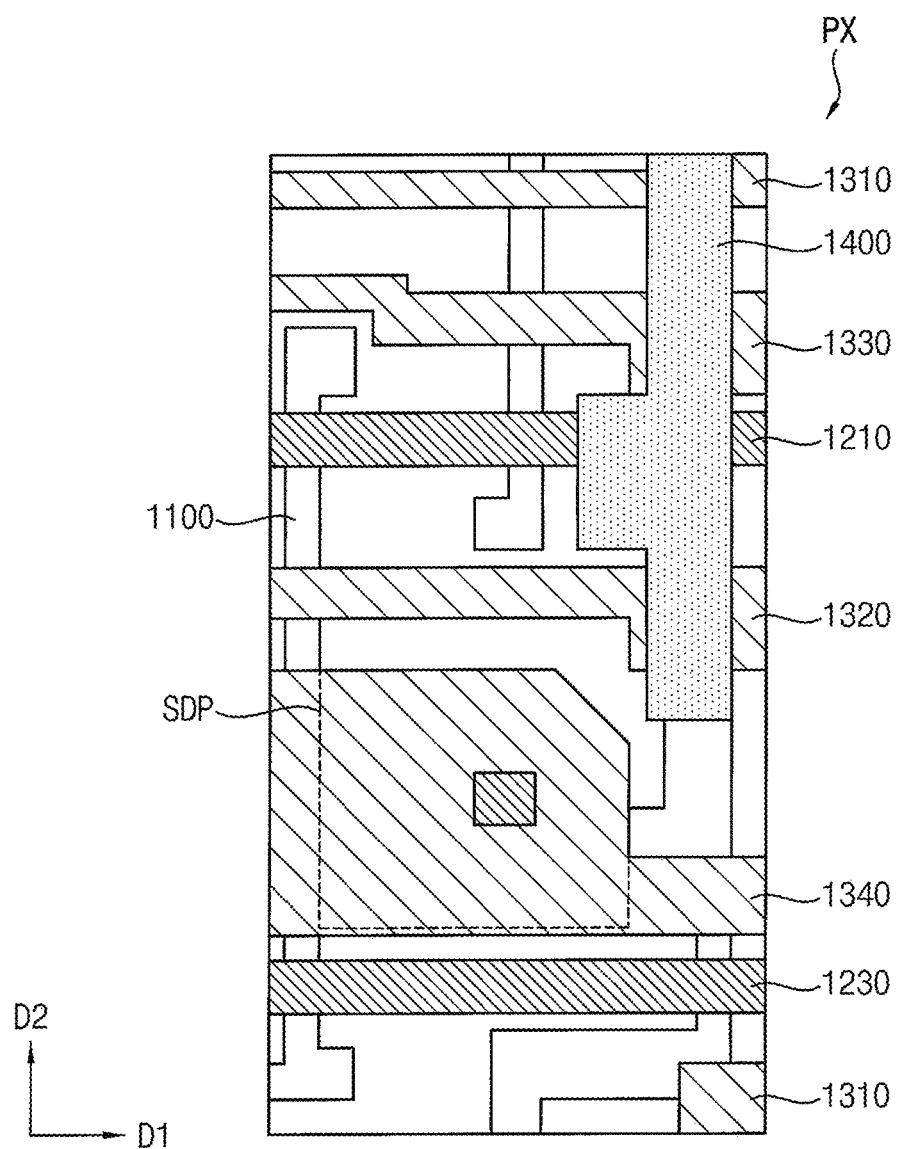

Referring to FIGS. 13 and 14, a second active pattern 1400 may be disposed on the first interlayer insulating layer. For example, the second active pattern 1400 may overlap the third gate line 1320 and the fourth gate line 1340 in a plan view.

In an embodiment, the second active pattern 1400 may be disposed on a different layer from the first active pattern 1100 and may not overlap the first active pattern 1100 in a plan view. In other words, the second active pattern 1400 may be disposed separately from the first active pattern 1100. For example, the first active pattern 1100 may include a silicon semiconductor, and the second active pattern 1400 may include an oxide semiconductor.

In an embodiment, the pixel structure PX may include the first, second, fifth, sixth and seventh transistors T1, T2, T5, T6, and T7 which are silicon-based semiconductor transistors, and the third and fourth transistors T3 and T4 which are oxide-based semiconductor transistors. For example, the first, second, fifth, sixth, and seventh transistors T1, T2, T5, T6, and T7 are the PMOS transistors and the third and fourth transistors T3 and T4 may be the NMOS transistors.

The third gate insulating layer may cover the second active pattern 1400 and may be disposed on the first interlayer insulating layer. The third gate insulating layer may include an insulating material.

Figure 15:
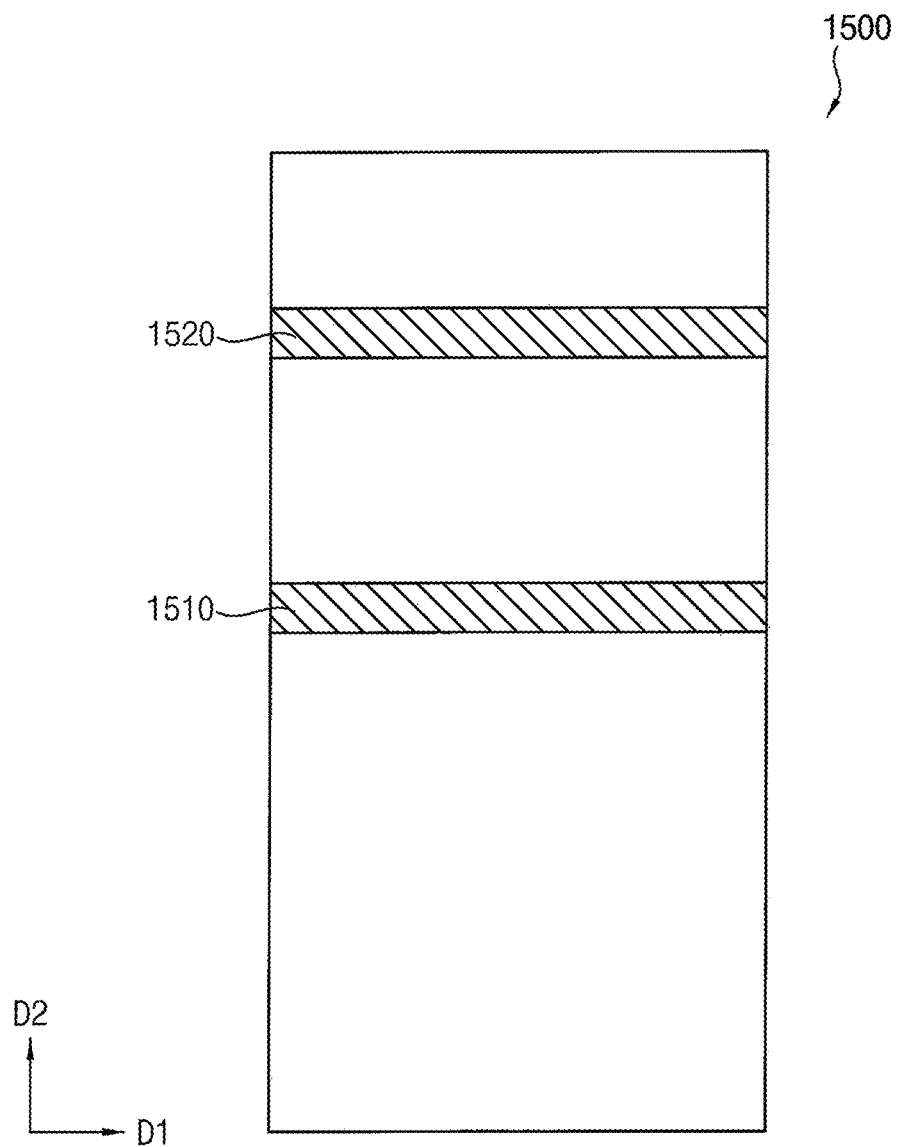
Figure 16:
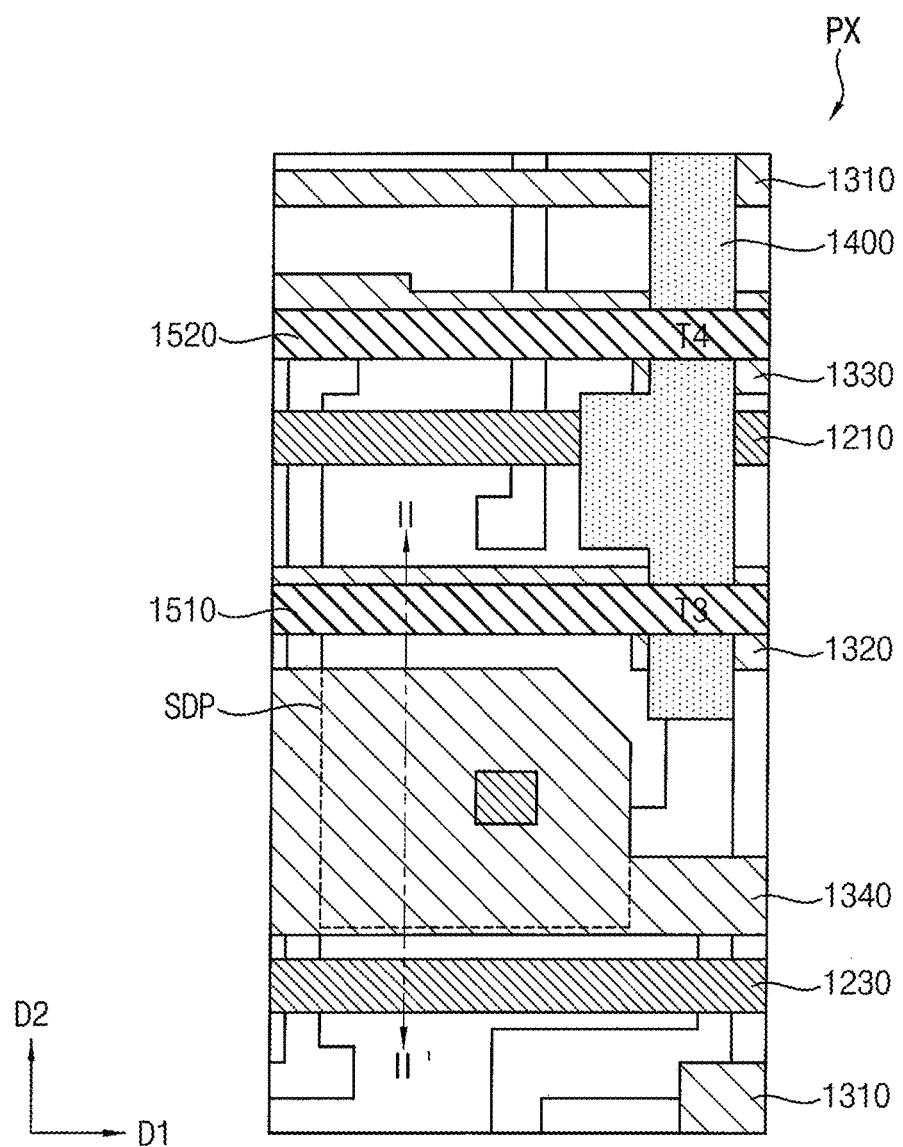

Referring to FIGS. 15 and 16, a third conductive pattern 1500 may be disposed on the third gate insulating layer. The third conductive pattern 1500 may include a fifth gate line 1510 and a sixth gate line 1520.

The fifth gate line 1510 may extend in the first direction D1. In an embodiment, the fifth gate line 1510 may overlap the third gate line 1320 in a plan view. In an embodiment, the fifth gate line 1510 may provide the second gate signal GC to the third transistor T3. For example, the fifth gate line 1510 may function as the gate terminal of the third transistor T3. For example, the fifth gate line 1510 may be referred to as an upper compensation control line.

The sixth gate line 1520 may extend in the first direction D1. In an embodiment, the sixth gate line 1520 may overlap the fourth gate line 1330 in a plan view. In an embodiment, the sixth gate line 1520 may provide the third gate signal GI to the fourth transistor T3. For example, the sixth gate line 1520 may function as the gate terminal of the fourth transistor T3.

The second interlayer insulating layer may cover the third conductive pattern 1500 and may be disposed on the third gate insulating layer. The second interlayer insulating layer may include an insulating material.

Figure 17:
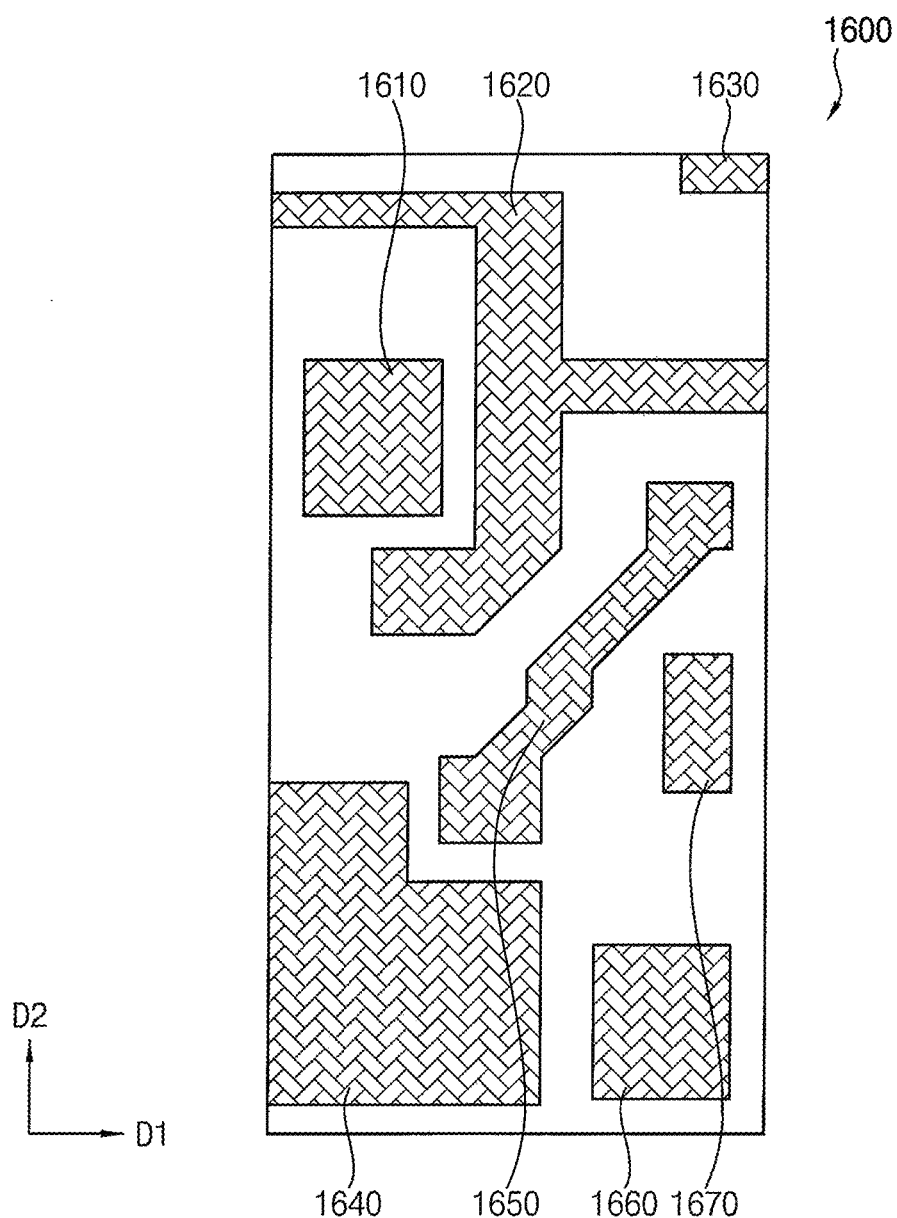
Figure 18:
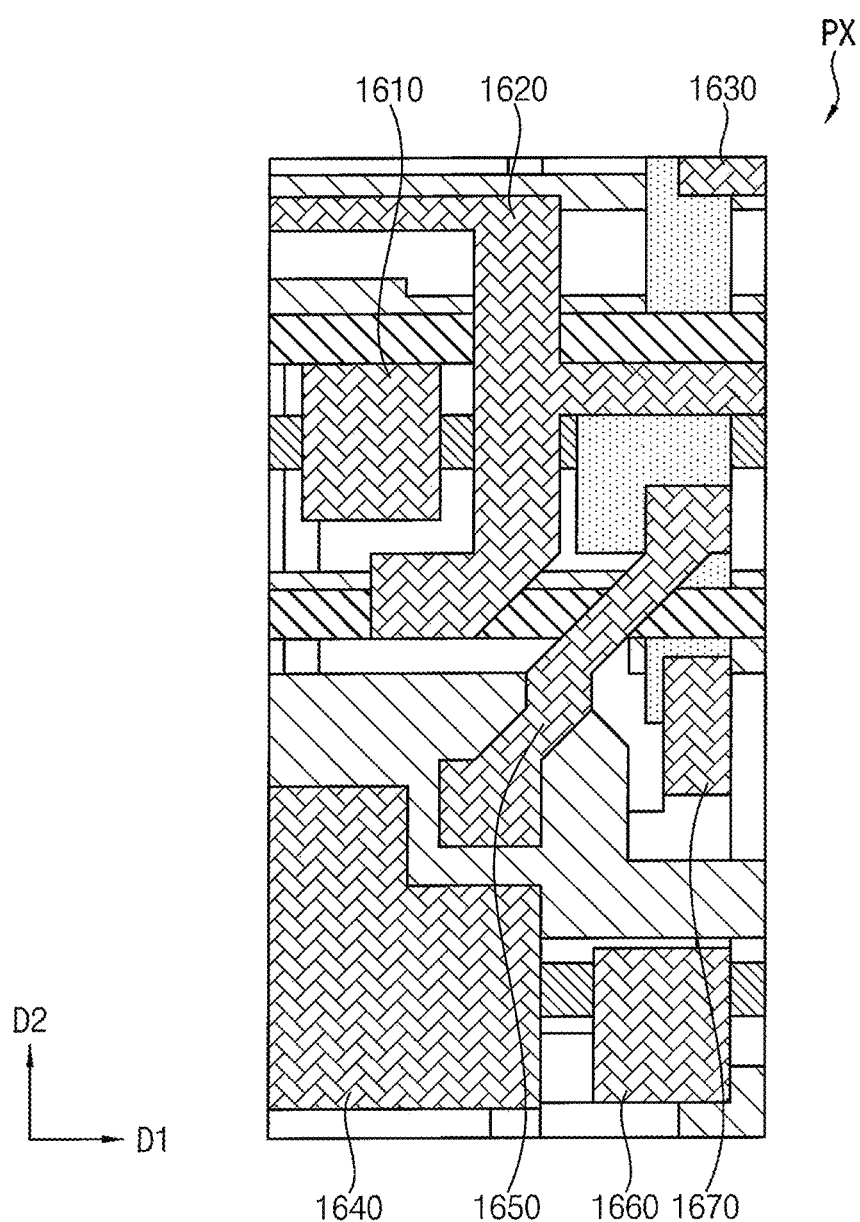

Referring to FIGS. 17 and 18, a fourth conductive pattern 1600 may be disposed on the second interlayer insulating layer. The fourth conductive pattern 1600 may include a data pad 1610, an anode initialization voltage line 1620, a gate initialization voltage connection pattern 1630, a high power voltage connection pattern 1640, a first compensation connection pattern 1650, a first anode pad 1660, and a second compensation connection pattern 1670.

The data pad 1610 may provide the data voltage DATA to the first active pattern 1100. The data pad 1610 may contact the first active pattern 1100 and a data line 1710 to be described later. For example, the data pad 1610 may overlap the first active pattern 1100 and the data line 1710 in a plan view.

The anode initialization voltage line 1620 may provide the anode initialization voltage AINT to the seventh transistor T7. For example, the anode initialization voltage line 1620 may provide the anode initialization voltage AINT to the first active pattern 1100. The anode initialization voltage line 1620 may contact the first active pattern 1100.

The gate initialization voltage connection pattern 1630 may provide the gate initialization voltage VINT to the fourth transistor T4. For example, the gate initialization voltage connection pattern 1630 may provide the gate initialization voltage VINT to the second active pattern 1400. The gate initialization voltage connection pattern 1630 may contact the gate initialization voltage line 1310 and the second active pattern 1400.

The high power voltage connection pattern 1640 may provide the high power voltage EVLDD to the first active pattern 1100. In an embodiment, the high power voltage connection pattern 1640 may electrically connect a high power voltage line to be described later with the first active pattern 1100. For example, the high power voltage connection pattern 1640 may contact the high power voltage line and the first active pattern 1100.

The first compensation connection pattern 1650 may electrically connect the gate terminal of the first transistor T1 and the second terminal of the third transistor T3. For example, the first compensation connection pattern 1660 may contact the second active pattern 1400 and the gate electrode 1220.

The first anode pad 1660 may provide the anode initialization voltage AINT or the driving current to the first terminal of the organic light emitting diode OLED. For example, the first anode pad 1660 may contact the first active pattern 1100 and a second anode pad (e.g., a second anode pad 1730 of FIG. 19).

The first via insulating layer may cover the fourth conductive pattern 1600 and may be disposed on the second interlayer insulating layer. The first via insulating layer may include an organic insulating material. For example, the first via insulating layer may include a photoresist, a polyacrylic resin, a polyimide resin, an acrylic resin, or the like.

Figure 19:
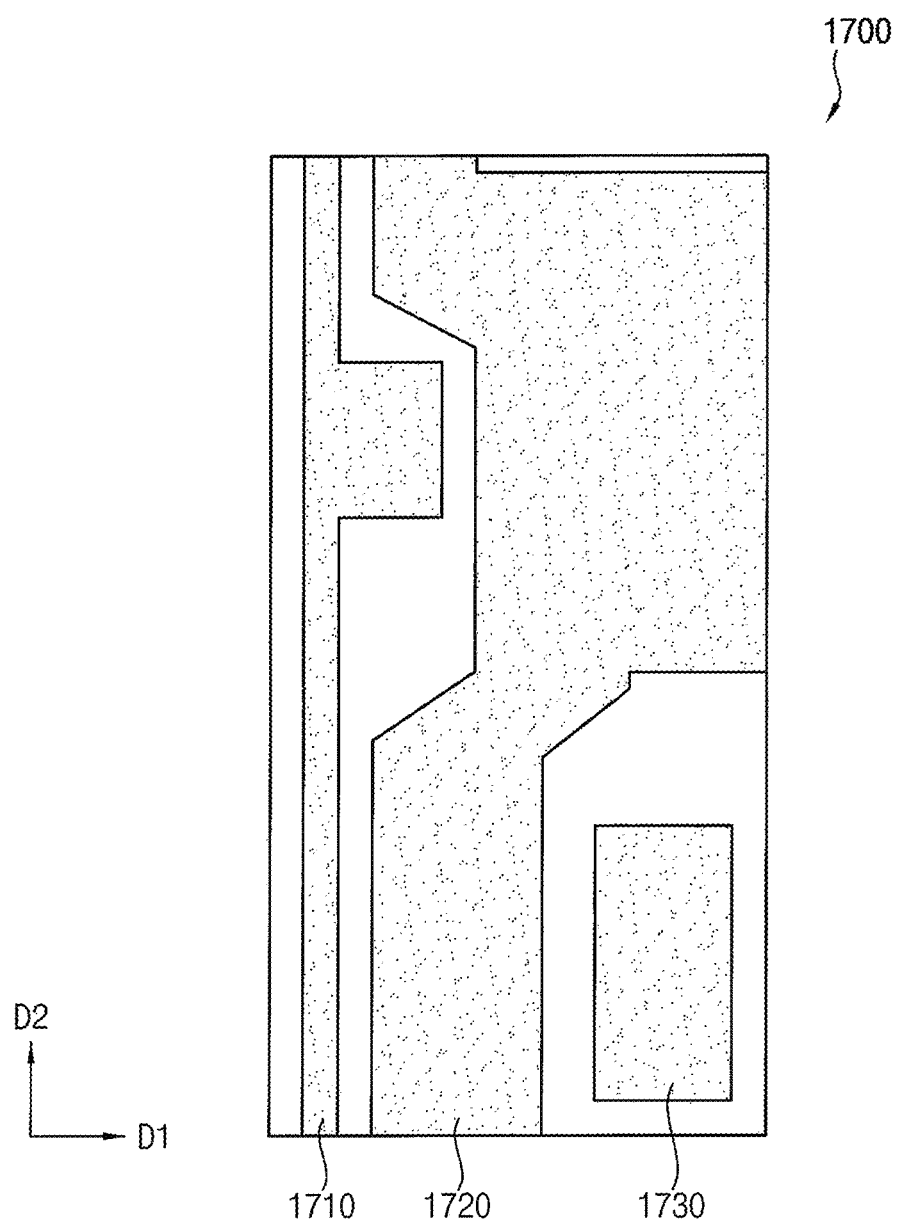
Figure 20:
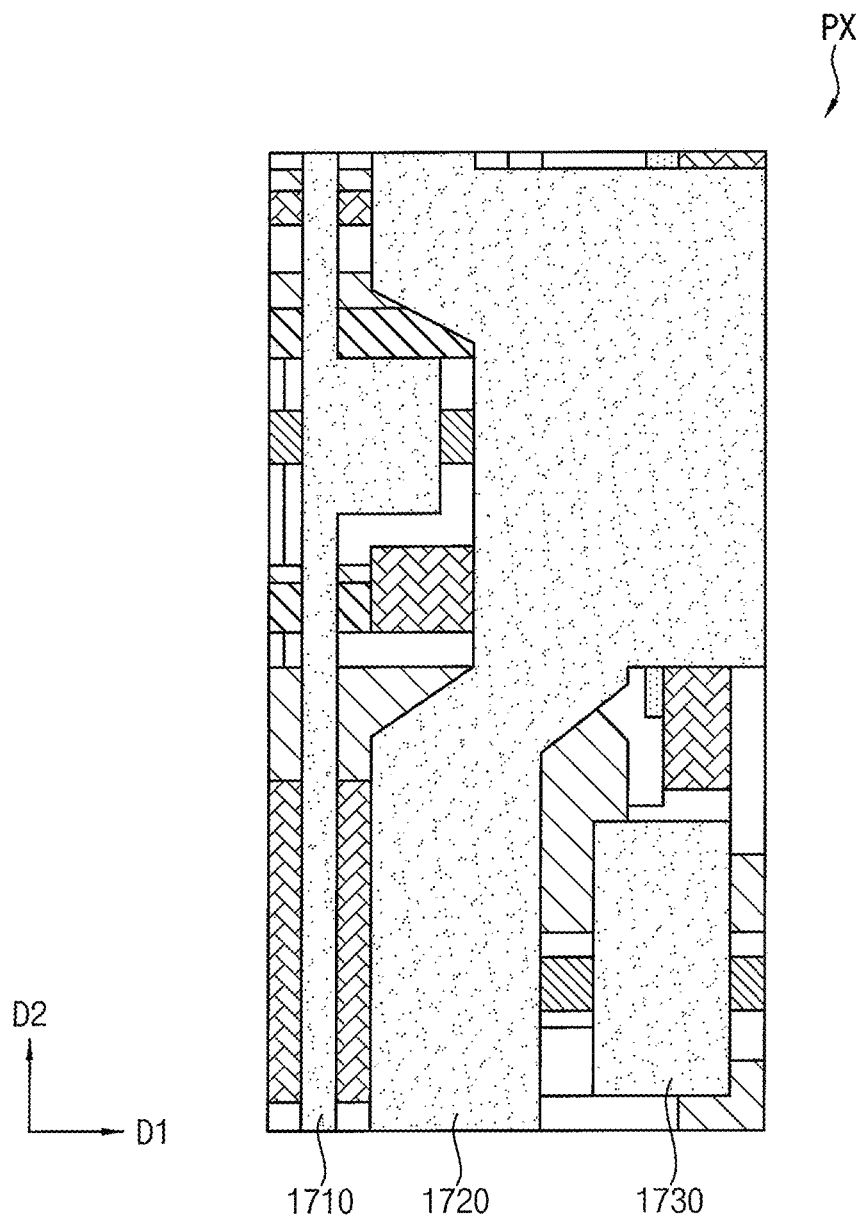

Referring to FIGS. 19 and 20, a fifth conductive pattern 1700 may be disposed on the first via insulating layer. The fifth conductive pattern 1700 may include a data line 1710, a high power voltage line 1720, and a second anode pad 1730.

The data line 1710 may extend in the second direction D2. In an embodiment, the data line 1710 may provide the data voltage DATA to the second transistor T2. The data line 1710 may contact the data pad 1610.

The high power voltage line 1720 may extend in the second direction D2. In an embodiment, the high power voltage line 1720 may provide the high power voltage ELVDD to the high power voltage connection pattern 1640. For example, the high power voltage line 1720 may contact the high power voltage connection pattern 1640.

In an embodiment, the high power voltage line 1720 may overlap the second active pattern 1400 in a plan view. For example, the second active pattern 1400 may include an oxide semiconductor. When the oxide semiconductor is exposed to light, a leakage current may be occurred through the third and fourth transistors T3 and T4 including the oxide semiconductor. For example, the light may be external light or light generated by the organic light emitting diode OLED. However, since the high power voltage interruption 1720 overlaps the second active pattern 1400 in a plan view, the second active pattern 1400 may not be exposed to the light.

The second anode pad 1730 may provide the anode initialization voltage AINT or the driving current to the first terminal of the organic light emitting diode OLED. For example, the second anode pad 1730 may contact the first anode pad 1660 and a first electrode (e.g., a first electrode ADE in FIG. 5).

The second via insulating layer may cover the fifth conductive pattern 1700 and may be disposed on the first via insulating layer. The second via insulating layer may include an organic insulating material. For example, the second via insulating layer may include a photoresist, a polyacrylic resin, a polyimide resin, an acrylic resin, or the like.

The emission layer 120 described with reference to FIG. 5 may be disposed on the second via insulating layer.

FIG. 21 is a cross-sectional view illustrating an example taken along line II-II' of FIG. 16.

Referring to FIGS. 16 and 21, the display panel 100 may include the base substrate SUB, the shielding pattern SDP, the buffer layer BFR, the first active pattern 1100, and the first gate insulating layer GI1, the gate electrode 1220, the second gate line 1230, the second gate insulating layer GI2, the third gate line 1320, the storage capacitor electrode 1340, the first interlayer insulating layer ILD1, and the fifth gate line 1510.

The base substrate SUB may include a first organic film layer PI1, a first barrier layer BRR1, a second organic film layer PI2, a second barrier layer BRR2, and a third barrier layer BRR3.

The first and second organic film layers PI1 and PI2 may include an organic material. For example, the first and second organic film layers PI1 and PI2 may include polyimide. The first, second, and third barrier layers BRR1, BRR2, and BRR3 may include an inorganic material. For example, the first, second, and third barrier layers BRR1, BRR2, and BRR3 may include silicon oxide.

In an embodiment, a thickness of the second barrier layer BRR2 may be smaller than a thickness of the third barrier layer BRR3 in the third direction D3. For example, the thickness of the second barrier layer BRR2 may be about 500 angstroms, and the thickness of the third barrier layer BRR3 may be about 4500 angstroms.

The shielding pattern SDP may be disposed on the second barrier layer BRR2. The third barrier layer BRR3 may cover the shielding pattern SDP and may be disposed on the second barrier layer BRR2. Since the thickness of the second barrier layer BRR2 is smaller than the thickness of the third barrier layer BRR3, the shielding pattern SDP may be relatively far away from the gate electrode 1220.

Accordingly, a coupling phenomenon between the second organic film layer PI2 and the gate electrode 1220 may be effectively prevented. In addition, since the second barrier layer BRR2 has a constant thickness, the second barrier layer BRR2 may protect the second organic film layer PI2 that may be damaged in a manufacturing process of the shielding pattern SDP.

The shielding pattern SDP may include amorphous silicon. In an embodiment, the shielding pattern SDP may be doped with the cations. In another embodiment, a constant voltage may be provided to the shielding pattern SDP. In still another embodiment, the emission control signal EM or the second gate signal GC may be provided to the shielding pattern SDP.

As described above, the emission control signal EM may be provided to the second gate line 1230, and the second gate signal GC may be provided to the third gate line 1320 and the fifth gate wire 1510. In order to turn on the fifth and sixth transistors T5 and T6, the emission control signal EM may have a negative voltage level. At the same time, in order to turn off the third transistor T3, the second gate signal GC may have a negative voltage level. Since the emission control signal EM and the second gate signal GC have the negative voltage level, an electric field may be formed in the second organic film layer PI2. Accordingly, organic materials of the second organic film layer PI2 may be polarized. A back channel may be formed in the first active pattern 1100 by the polarized organic materials if there is no shielding pattern SDP. Electrical characteristics (e.g., threshold voltage, electron mobility, etc.) of the first transistor T1 may be changed by the back channel. Accordingly, the pixel structure PX including the first transistor T1 whose electrical characteristics have been changed may emit luminance not corresponding to the data voltage DATA, and display quality of the display device may be deteriorated.

However, the display device 10 according to an embodiment may include the shielding pattern SDP disposed inside the base substrate SUB. The shielding pattern SDP may shield the polarized organic materials and the first active pattern 1100. Accordingly, the back channel may not be formed in the first active pattern 1100 and electrical characteristics of the first transistor T1 may not be changed. Accordingly, display quality of the display device 10 may be improved.

In addition, the polarization phenomenon of the organic materials may be further accelerated by light incident on the display panel 100 described with reference to FIG. 4 (e.g., the light 11 or the light 12 of FIG. 4) if there is no shielding pattern SDP. Accordingly, in an embodiment, the shielding pattern SDP may overlap the fingerprint recognition area FA and may not overlap the display area DA in a plan view. In other words, the shielding pattern SDP is disposed only on the part of the display panel 100 overlapping the fingerprint recognition area FA, and may not be disposed on the part of the display panel 100 overlapping the display area DA in a plan view. In another embodiment, the shielding pattern SDP may be disposed on the display panel 100 overlapping the fingerprint recognition area FA and the display area DA.

Figure 22:
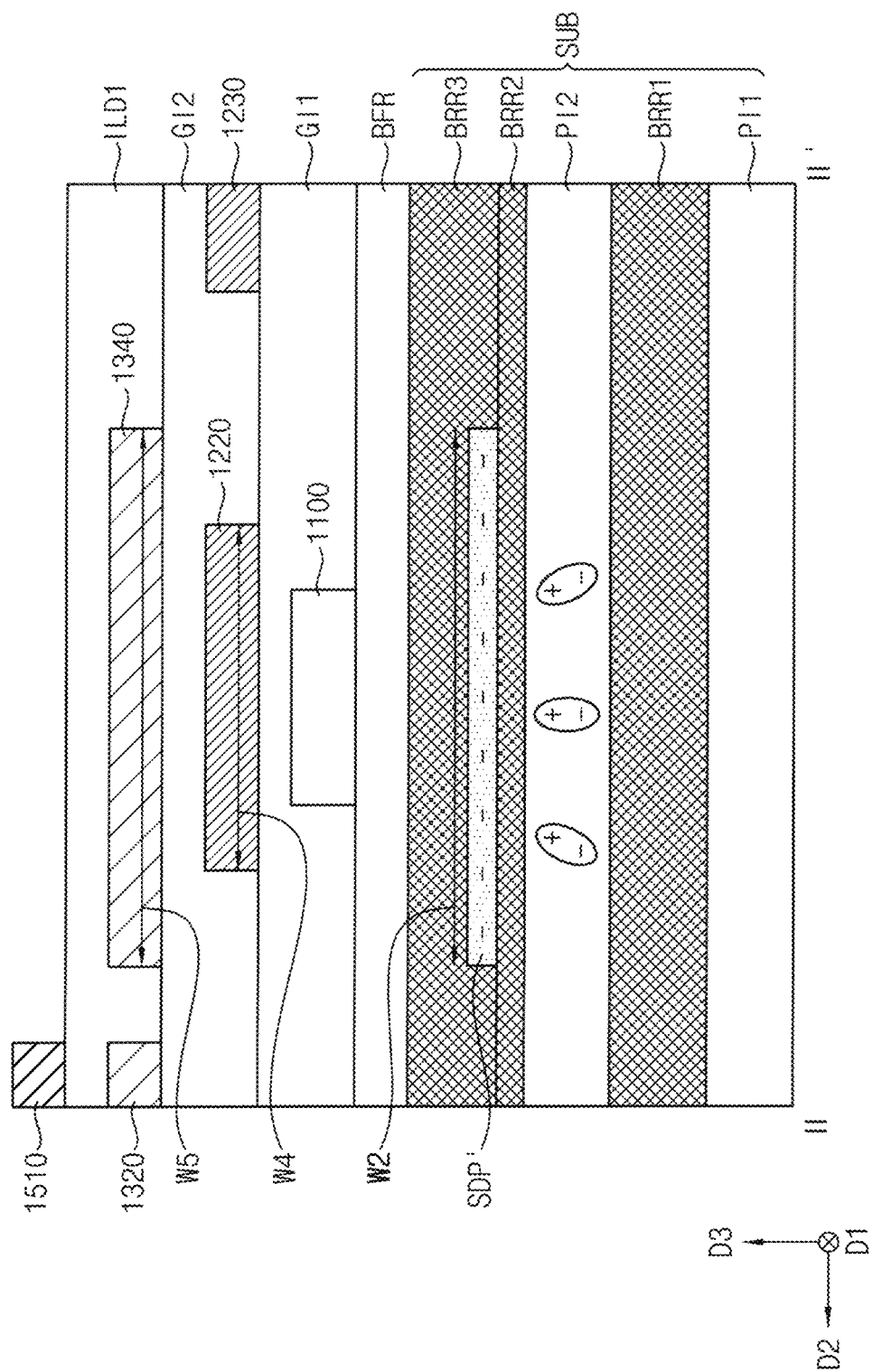
FIG. 22 is a cross-sectional view illustrating another example taken along line II-II' of FIG. 16.

FIG. 22 is a cross-sectional view illustrating another example taken along line II-II' of FIG. 16.

Referring to FIGS. 16 and 22, the display panel 100 may include the base substrate SUB, a shielding pattern SDP', the buffer layer BFR, the first active pattern 1100, and the first gate insulation layer GIL the gate electrode 1220, the second gate line 1230, the second gate insulating layer GI2, the third gate line 1320, the storage capacitor electrode 1340, the first interlayer insulating layer ILD1, and the fifth gate line 1510. However, since the remaining components except for the shielding pattern SDP' have been described with reference to FIG. 21, the shielding pattern SDP' will be described below.

The shielding pattern SDP' may include amorphous silicon. In an embodiment, the shielding pattern SDP' may be doped with anions. In another embodiment, a constant voltage may be provided to the shielding pattern SDP'. In still another embodiment, the emission control signal EM or the second gate signal GC may be provided to the shielding pattern SDP'.

The display device 10 according to the embodiment may include the shielding pattern SDP' disposed inside the base substrate SUB. The shielding pattern SDP' may shield the polarized organic materials and the first active pattern 1100. Accordingly, the back channel may not be formed in the first active pattern 1100 and electrical characteristics of the first transistor T1 may not be changed. Accordingly, display quality of the display device 10 may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a first organic film layer;
   a first barrier layer disposed on the first organic film layer;
   a shielding pattern disposed on the first barrier layer;
   a second barrier layer covering the shielding pattern and disposed on the first barrier layer;
   a first active pattern disposed on the second barrier layer and overlapping the shielding pattern in a plan view;
   a gate electrode disposed on the first active pattern;
   a first gate line disposed on the first active pattern and adjacent to a first side of the gate electrode in the plan view;
   a second gate line disposed on a layer on the first gate line and adjacent to a second side of gate electrode in the plan view, the second side being opposite to the first side; and
   a second active pattern disposed on another layer on the first gate line.

2. The display panel of claim 1, wherein the shielding pattern includes amorphous silicon.

3. The display panel of claim 1, wherein the shielding pattern, the first active pattern and the gate electrode overlap each other in the plan view.

4. The display panel of claim 1, wherein a planar shape of the shielding pattern is the same as a planar shape of the gate electrode in the plan view.

5. The display panel of claim 1, wherein a size of the shielding pattern is greater than or equal to a size of the gate electrode.

6. The display panel of claim 5, wherein a maximum width of the shielding pattern in a first direction is greater than a maximum width of the gate electrode in the first direction, and
   wherein a maximum width of the shielding pattern in a second direction crossing the first direction is greater than a maximum width of the gate electrode in the second direction.

7. The display panel of claim 6, wherein the width of the shielding pattern in the first direction is greater than the width of the gate electrode in the first direction by about 0.8 micrometers (μm) to about 1.2 μm.

8. The display panel of claim 6, wherein the width of the shielding pattern in the second direction is greater than the width of the gate electrode in the second direction by about 0.8 μm to about 1.2 μm.

9. The display panel of claim 1, wherein a thickness of the shielding pattern is about 500 angstroms to about 1500 angstroms.

10. The display panel of claim 1, further comprising:
    a third barrier layer disposed under the first organic film layer; and
    a second organic film layer disposed under the third barrier layer.

11. The display panel of claim 10, wherein a thickness of the first barrier layer is smaller than a thickness of the second barrier layer.

12. The display panel of claim 10, wherein a thickness of the third barrier layer is equal to a sum of a thickness of the first barrier layer and a thickness of the second barrier layer.

13. The display panel of claim 1, wherein the first active pattern includes polycrystalline silicon, and
    wherein the second active pattern includes an oxide semiconductor.

14. The display panel of claim 13, wherein cations are doped in the first active pattern, and
    wherein the cations are doped in the shielding pattern.

15. The display panel of claim 13, wherein cations are doped in the first active pattern, and
    wherein the anions are doped in the shielding pattern.

16. The display panel of claim 1, wherein a constant voltage is provided to the shielding pattern.

17. The display panel of claim 1, further comprising:
    a third gate line disposed between the gate electrode and the second active pattern, and
    wherein the second gate line is disposed on the second active pattern and overlapping the third gate line in the plan view.

18. A display device comprising a display panel overlapping a display area in a plan view,
    wherein the display panel comprises:
    a first organic film layer;
    a first barrier layer disposed on the first organic film layer;
    a shielding pattern disposed on the first barrier layer;
    a second barrier layer covering the shielding pattern and disposed on the first barrier layer;
    a first active pattern disposed on the second barrier layer and overlapping the shielding pattern in the plan view;
    a gate electrode disposed on the first active pattern;
    a first gate line disposed on the first active pattern and adjacent to a first side of the gate electrode in the plan view;
    a second gate line disposed on a layer on the first gate line and adjacent to a second side of gate electrode in the plan view, the second side being opposite to the first side; and
    a second active pattern disposed on another layer on the first gate line.

19. The display device of claim 18,
    wherein the display panel further comprises:
    a third barrier layer disposed under the first organic film layer;
    a second organic film layer disposed under the third barrier layer; and
    a third gate line disposed between the gate electrode and the second active pattern,
    wherein the second gate line is disposed on the second active pattern and overlaps the third gate line in the plan view,
    wherein the shielding pattern is disposed between the second barrier layer and the third barrier layer, wherein cations are doped in the shielding pattern,
    wherein the first active pattern is disposed on the third barrier layer and includes polycrystalline silicon, wherein the cations are doped in the first active pattern, and wherein the second active pattern includes an oxide semiconductor.

20. The display device of claim 18, further comprising:

an optical sensor module disposed under the display panel and overlapping a fingerprint recognition area in the plan view; and an air layer defined between the display panel and the optical sensor module and overlapping the fingerprint recognition area in the plan view, wherein the display panel overlaps the display area and the fingerprint recognition area in the plan view, and wherein the shielding pattern overlaps the fingerprint recognition area and does not overlap the display area in the plan view.

* * * * *